United States Patent
Palaskas et al.

(10) Patent No.: US 10,707,848 B2
(45) Date of Patent: Jul. 7, 2020

(54) APPARATUS AND METHOD FOR INTERPOLATING BETWEEN A FIRST AND A SECOND SIGNAL

(71) Applicant: Intel IP Corporation, Santa Clara, CA (US)

(72) Inventors: Georgios Palaskas, Portland, OR (US); Sebastian Sievert, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/474,560

(22) PCT Filed: Mar. 31, 2017

(86) PCT No.: PCT/US2017/025244
§ 371 (c)(1),
(2) Date: Jun. 28, 2019

(87) PCT Pub. No.: WO2018/182662
PCT Pub. Date: Oct. 4, 2018

(65) Prior Publication Data
US 2019/0356306 A1     Nov. 21, 2019

(51) Int. Cl.
*H03K 5/13* (2014.01)
*G04F 10/06* (2006.01)
(Continued)

(52) U.S. Cl.
CPC .............. *H03K 5/13* (2013.01); *G04F 10/06* (2013.01); *H03K 2005/00052* (2013.01); *H04W 84/042* (2013.01)

(58) Field of Classification Search
CPC ..................................................... H03K 5/13
(Continued)

(56) References Cited

U.S. PATENT DOCUMENTS 9,407,245 B2    8/2016 Sievert et al.
9,806,759 B1   10/2017 Sievert et al.
(Continued)

OTHER PUBLICATIONS

Takanori Saeki et al., "A 1.3-Cycle Lock Time, Non-PLL/DLL Clock Multiplier Based on Direct Clock Cycle Interpolation for 'Clock on Demand'," IEEE Journal of Solid-State Circuits (vol. 35, No. 11, Nov. 2000).
(Continued)

*Primary Examiner* — Howard Williams
(74) *Attorney, Agent, or Firm* — Kowert, Hood, Munyon, Rankin & Goetzel, P.C.

(57) ABSTRACT

An apparatus for interpolating between a first and a second signal is provided. The apparatus includes a plurality of interpolation cells coupled to a common node of the apparatus. Further, the apparatus includes a control circuit configured to supply, based on a control word, respective selection signals to each of the plurality of interpolation cells. At least one of the plurality of interpolation cells is configured to couple the common node to a first potential if the first signal and the second signal are both at a first signal level, couple the common node to a second potential, which is different from the first potential, if the first signal and the second signal are both at a second signal level, which is different from the first signal level, and to decouple the common node from at least one of the first potential and the second potential if the first signal and the second signal are at different signal levels. Additionally, the at least one of the plurality of interpolation cells is configured to switch, based on a state indicated by the respective selection signal, to coupling the common node to the second potential in response to a transition of either the leading one or the trailing one of the first signal and the second signal from the first signal level to the second signal level.

25 Claims, 8 Drawing Sheets

(51) Int. Cl.
  *H03K 5/00*  (2006.01)
  *H04W 84/04*  (2009.01)
(58) Field of Classification Search
  USPC .......................................................... 341/111
  See application file for complete search history.

(56) References Cited

U.S. PATENT DOCUMENTS

| | | | | |
|---|---|---|---|---|
| 10,110,245 | B2* | 10/2018 | Degani | ................ H03M 1/007 |
| 2006/0132110 | A1 | 6/2006 | Tang | |
| 2009/0102523 | A1* | 4/2009 | Kim | ........................ H03L 7/07 327/149 |
| 2010/0079180 | A1 | 4/2010 | Kim et al. | |
| 2014/0203858 | A1* | 7/2014 | Cho | ...................... H03K 5/133 327/237 |
| 2014/0270031 | A1 | 9/2014 | Huang et al. | |
| 2015/0381156 | A1 | 12/2015 | Sievert et al. | |
| 2017/0093556 | A1 | 3/2017 | Degani et al. | |
| 2018/0175842 | A1* | 6/2018 | Sievert | ................... H03K 5/131 |

OTHER PUBLICATIONS

Aravind Tharayil Narayanan et al., "A Fractional-N Sub-Sampling PLL using a Pipelined Phase-Interpolator with an FoM of −250 dB," IEEE Journal of Solid-State Circuits (vol. 51, No. 7, Jul. 2016).

Aravind Tharayil Narayanan et al., "A Fractional-N Sub-Sampling PLL using a Pipelined Phase-Interpolator with a FoM of −246dB," ESSCIRC Conference 2015—41st European Solid-State Circuits Conference (ESSCIRC) (Sep. 14, 2015).

Ankur Agrawal et al., "A 19-Gb/s Serial Link Receiver With Both 4-Tap FFE and 5-Tap DFE Functions in 45-nm SOI CMOS," IEEE Journal of Solid-State Circuits (vol. 47, No. 12, Dec. 2012).

* cited by examiner

APPARATUS AND METHOD FOR INTERPOLATING BETWEEN A FIRST AND A SECOND SIGNAL

FIELD

Examples relate to phase interpolation. In particular, examples relate to an apparatus and a method for interpolating between a first and a second signal.

BACKGROUND

A Digital-to-Time Converter (DTC) commonly comprises a Multi-Modulus Divider (MMD) providing a coarse phase modulation and Digitally-Controlled Edge Interpolator (DCEI) providing the fine modulation. Current DCEI architectures have several challenges. For example, the current consumption of the DCEI is code-dependent so that dynamic errors rise in the presence of finite load regulation (as it is the case for Low-DropOut, LDO, regulators). Moreover, dynamic errors occur when the coarse modulation by the MMD changes. Also, there is a trade-off between static Integral Non-Linearity (INL), power dissipation and phase noise.

Hence, there may be a desire for an improved phase interpolation architecture.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
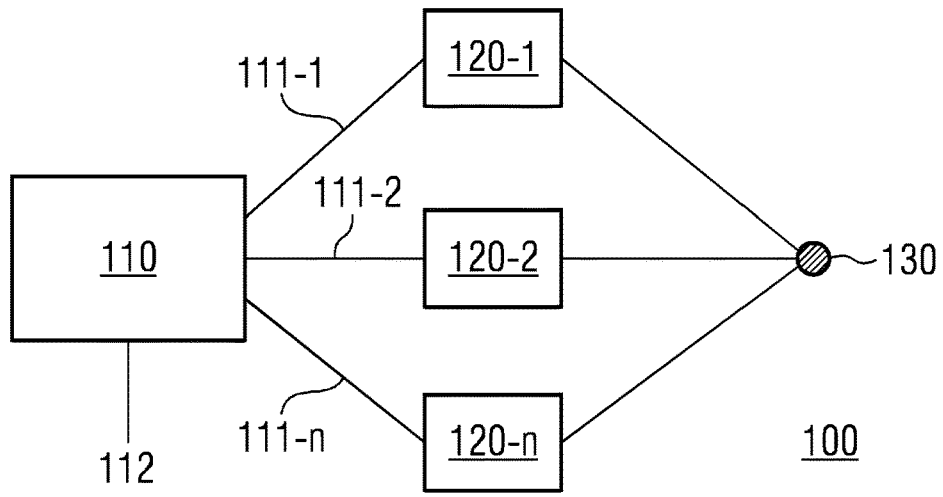
FIG. 1 illustrates an example of an apparatus for interpolating between a first and a second signal.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), LTE or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an apparatus 100 for interpolating between a first and a second signal. The apparatus 100 comprises a plurality of interpolation cells 120-1, 120-2, . . . , 120-n coupled to a common node 130 of the apparatus 100. Further, the apparatus 100 comprises a control circuit 110 configured to supply, based on a control word 112, respective selection signals 111-1, 111-2, . . . , 111-n to each of the plurality of interpolation cells 120-1, 120-2, . . . , 120-n.

At least one of the plurality of interpolation cells 120-1, 120-2, . . . , 120-n is configured to couple the common node 130 to a first potential if the first signal and the second signal are both at a first signal level, couple the common node 130 to a second potential, which is different from the first potential, if the first signal and the second signal are both at a second signal level, which is different from the first signal level, and to decouple the common node 130 from at least one of the first potential and the second potential if the first signal and the second signal are at different signal levels.

Additionally, the at least one of the plurality of interpolation cells 120-1, 120-2, . . . , 120-n is configured to switch, based on a state indicated by the respective selection signal 111-1, 111-2, . . . , 111-n, to coupling the common node 130 to the second potential in response to a transition of either the leading one or the trailing one of the first signal and the second signal from the first signal level to the second signal level.

The apparatus 100 may allow to selectively activate one or more of the plurality of interpolation cells 120-1, 120-2, . . . , 120-n in response to the transition of the leading one of the first signal and the second signal from the first signal level to the second signal level. Additionally, the apparatus 100 may allow to selectively activate one or more of the plurality of interpolation cells 120-1, 120-2, . . . , 120-n in response to the transition of the trailing one of the first signal and the second signal from the first signal level to the second signal level. Depending on the number of cells that are activated in response the leading one vs. the number of cells that are activated in response the trailing one, an output of the apparatus 100 may change faster or slower. For example, an almost linear variation of the output delay with code (i.e. the control word) may be achieved. Additionally, the apparatus 100 may allow a contention-free operation, i.e., times when conductive paths of the apparatus 100 of different conductivity are both on (and shorting the first and the second potential) may be avoided. Also, the apparatus 100 may enable to keep the output at a defined potential without any additional circuitry, when no interpolation is taking place (i.e. when the first and the second signal are at the same signal level). The apparatus 100 may, hence, allow phase interpolation with low dynamic errors, low INL, low power dissipation and low noise.

The plurality of interpolation cells 120-1, 120-2, . . . , 120-n may receive the first and the second signal. The first and the second signal may, e.g., be oscillation signals. The first and second signal may have the same frequency. The first and second signal are phase-shifted with respect to each other. For example, the first and second signal may have different transition times from the first signal level to the second signal level. The first signal level of a signal is a level that is related to a first logic state, whereas the second signal level of a signal is a level that is related to a different second logic state. That is, a signal indicates the first logic state if it is at the first signal level, whereas the signal indicates the second logic state if the signal is at the second signal level. For example, the first signal level may indicate "1" or "high" and the second signal level may indicate "0" or "low", and vice versa. The signal level may, e.g., be a voltage of the signal. In some examples, the transition from the first signal level to the second signal level may be a falling signal edge. In other examples, the transition from the first signal level to the second signal level may be a rising signal edge. That is, the first signal level may be higher than the second signal level, or the first signal level may be lower than the second signal level.

The apparatus 100 may, e.g., further comprise a frequency divider circuit configured to generate the first signal and the second signal based on an oscillation signal. The oscillation signal may be generated by a Local Oscillator (LO). For example, the frequency divider circuit may comprise a MMD for generating the first signal and the second signal based on the oscillation signal. For example, the LO may generate the oscillation signal with a frequency of 8 GHz, and the MMD may generate the first and the second signal with a frequency of 2 GHz, wherein the first and the second signal have a delay difference of $\pm T_{LO}/2$ (e.g. 62.5 ps for LO at 8 GHz), i.e. a 45° phase shift. Which of the first and second signal is leading or trailing may generally change over time according to a selected modulation or operation range. The proposed architecture may allow to exploit the knowledge of the first and second signals temporal order in a feed-forward manner in order to linearize the interpolation.

The first (electric) potential may, e.g., be one of $V_{ss}$ and $V_{cc}$, whereas the second (electric) potential may be the other one of $V_{ss}$ and $V_{cc}$. Based on the signal levels of the first and the second signal, the common node may be coupled to one of $V_{ss}$ and $V_{cc}$ via each of the plurality of interpolation cells 120-1, 120-2, ..., 120-n. For example, if the common node of the apparatus 100 is coupled with a load capacitor, the capacitor may be charged faster or slower.

Figure 2A:
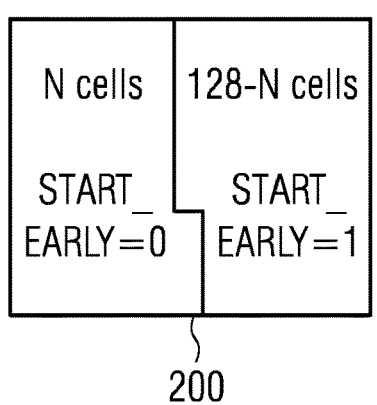
FIG. 2a illustrates an example of a configuration of the plurality of interpolation cells.
Figure 2B:
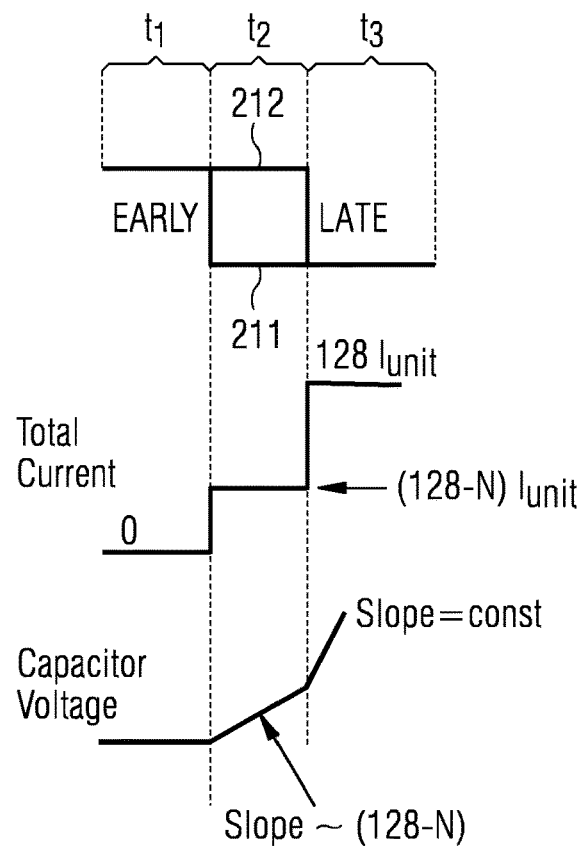
FIG. 2b illustrates an example of a current and a voltage at the common node.

This is illustrated in FIGS. 2a and 2b. FIG. 2a illustrates an example of an array 200 comprising 128 interpolation cells. It is evident that any other number of interpolation cells may be used instead. N interpolation cells of the 128 interpolation cells receive a respective selection signal from the control circuit that indicates a first state. For example, the first state may instruct the respective interpolation cell to switch to coupling the common node to the second potential in response to a transition of the trailing one of the first signal and the second signal from the first signal level to the second signal level. 128-N interpolation cells of the 128 interpolation cells (i.e. the remaining interpolation cells) receive a selection signal from the control circuit that indicates a different second state. For example, the second state may instruct the respective interpolation cell to switch to coupling the common node to the second potential in response to a transition of the leading one of the first signal and the second signal from the first signal level to the second signal level.

The effect of this operation is illustrated in FIG. 2b. FIG. 2b illustrates the temporal course of the leading one 211 and the trailing one 212 of the first signal and the second signal, the temporal course of the total current 220 supplied to the common node by the 128 interpolation cells, and the temporal course of the voltage 230 at a capacitance present at the common node (e.g. a parasitic layout capacitance at the common node or a dedicated capacitor coupled to the common node; a dedicated capacitor may further increase the linearity).

During the first time period $t_1$, the first signal and the second signal are both high, i.e., at the same first signal level. Accordingly, the 128 interpolation cells couple the common node to the first potential (e.g. $V_{ss}$ or ground) during the first time period $t_1$. Then, the leading one 211 of the first signal and the second signal changes from high to low (i.e. from the first signal level to a second signal level). The 128-N interpolation cells (receiving respective selection signals indicating the second state) switch to coupling the common node to the second potential (e.g. $V_{cc}$). As a consequence, a total current of (128-N)*$I_{unit}$ ($I_{unit}$ denoting a unit current) is supplied to the common node during the second time period $t_2$. The second time period $t_2$ ends, when also the trailing one 212 of the first signal and the second signal changes from high to low (i.e. from the first signal level to the second signal level). During the second time period $t_2$, the capacitor gets charged by the current supplied to the common node by the 128-N interpolation cells, i.e., the increase rate of the capacitor voltage is proportional to 128-N. During the third period $t_3$, which begins when the trailing one 212 of the first signal and the second signal changes from high to low, also the N interpolation cells (receiving respective selection signals indicating the first state) switch to coupling the common node to the second potential. As a consequence, a total current of 128*$I_{unit}$ is supplied to the common node during the third time period $t_3$. During the third time period $t_3$, the capacitance gets charged by the current supplied to the common node by the 128 interpolation cells.

It is evident from the above description that the increase rate of the voltage may be controlled based on the fraction of interpolation cells that switches in response the leading one of the first and second signal, and vice versa. By controlling the increase rate of the voltage, the apparatus may interpolation between the first signal and the second signal.

The common node may, e.g., be coupled to an inverter. When the voltage at the common node, i.e., the input voltage of the inverter, crosses a (predefined) threshold voltage, the output of the inverter changes (i.e. a change of the output state occurs). By controlling the voltage at the common node, i.e., the input voltage of the inverter, the time of the threshold crossing may be controlled. In other words, the time of changing the inverter output may be controlled based on the fraction of interpolation cells that switches in response the leading one of the first and second signal, and vice versa. Accordingly, the output delay of the apparatus 100 may be controlled.

It is to be noted that the apparatus may interpolate contention-free, since during the second time period $t_2$, at maximum one of the first and the second potentials is coupled to the common node by each of the 128 interpolation cells. The INL as well as dynamic errors may be reduced due to the linearized interpolation. Therefore, a current consumption of the apparatus may be more constant. Furthermore, a short circuit between the first and the second potential within a respective interpolation cell may be avoided.

That is, the at least one of the plurality of interpolation cells 120-1, 120-2, ..., 120-n illustrated in FIG. 1 may be configured to switch to coupling the common node to the second potential in response to the transition of the trailing one of the first signal and the second signal from the first signal level to the second signal level, if the selection signal indicates a first state. Alternatively, the at least one of the plurality of interpolation cells 120-1, 120-2, ..., 120-n may be configured to switch to coupling the common node to the second potential in response to the transition of the leading one of the first signal and the second signal from the first signal level to the second signal level, if the selection signal indicates a different second state.

The apparatus 100 may interpolate rising and falling signal edges. Therefore, the at least one of the plurality of interpolation cells 120-1, 120-2, ..., 120-n may be further configured to switch, based on the state indicated by the respective selection signal, to coupling the common node to the first potential in response to a subsequent transition of either the leading one or the trailing one of the first signal and the second signal from the second signal level to the first signal level.

For example, the at least one of the plurality of interpolation cells 120-1, 120-2, ..., 120-n may be further configured to switch to coupling the common node 130 to the first potential in response to the transition of the trailing one of the first signal and the second signal from the second signal level to the first signal level, if the selection signal indicates the first state. Alternatively, the at least one of the plurality of interpolation cells 120-1, 120-2, ..., 120-n may be further configured to switch to coupling the common node 130 to the first potential in response to the transition of the leading one of the first signal and the second signal from the second signal level to the first signal level, if the selection signal indicates the different second state.

In some examples, the at least one of the plurality of interpolation cells 120-1, 120-2, . . . , 120-n may comprise a first pull-up/down path comprising a first plurality of transistors coupled between the first potential and the second potential. The first pull-up/down path is configured to couple the common node to one of the first potential and the second potential if the selection signal indicates a first state. Further, the at least one of the plurality of interpolation cells 120-1, 120-2, . . . , 120-n may comprise a second pull-up/down path comprising a second plurality of transistors coupled between the first potential and the second potential.

The second pull-up/down path is configured to couple the common node to one of the first potential and the second potential if the selection signal indicates a different second state. In other words, for different states of the selection signal, the at least one of the plurality of interpolation cells 120-1, 120-2, . . . , 120-n may comprise different pull-up/down paths configured to couple the common node to one of the first potential and the second potential.

In the following, various examples of interpolation cells are described more detailed with reference to FIGS. 3 to 6. In particular, FIGS. 3 to 6 illustrates different architectures for the first and second pull-up/down paths of an interpolation cell as well as additional (optional) features of interpolation cells and/or apparatuses for interpolating between a first and a second signal according to the proposed architecture.

Figure 3:
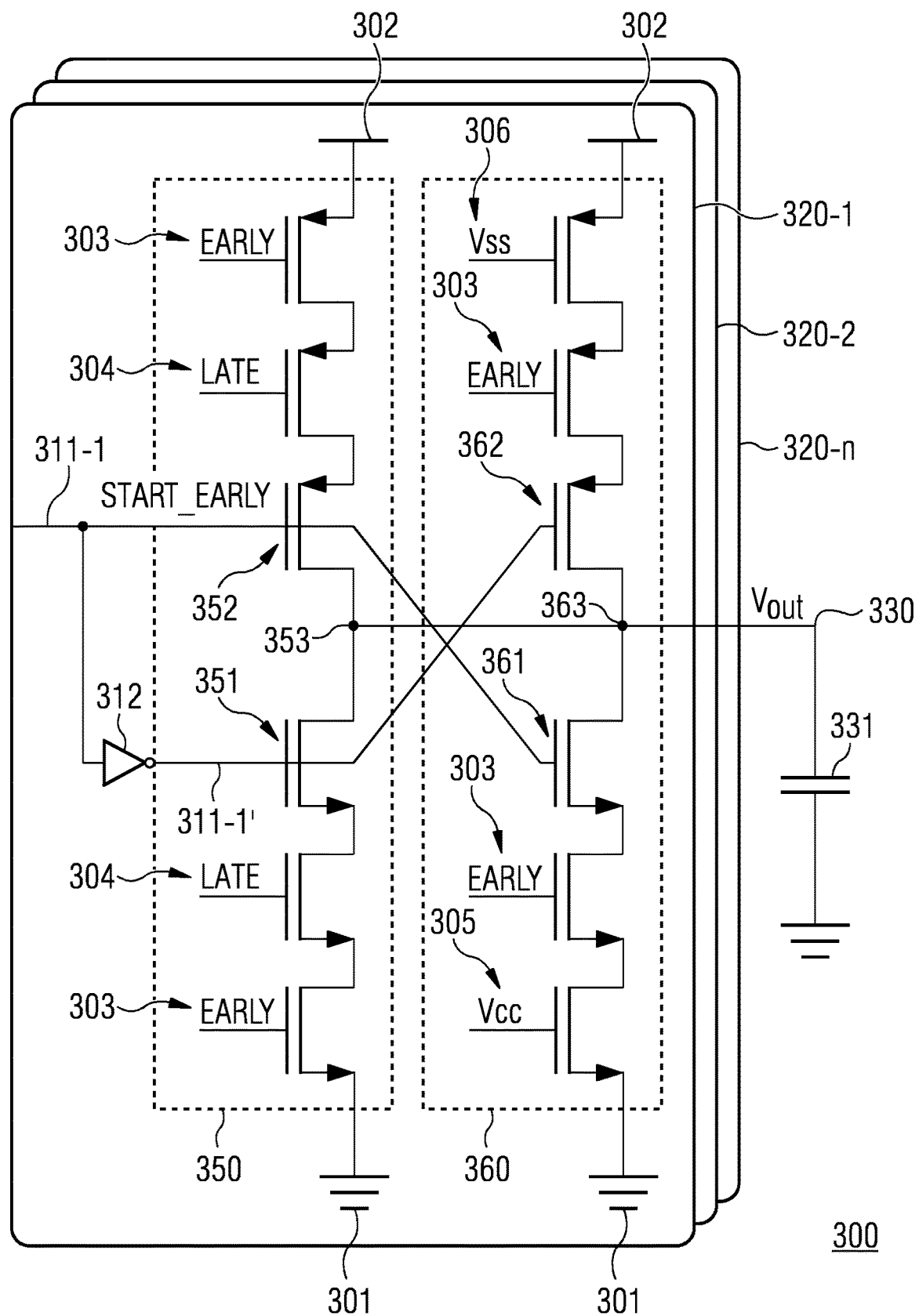
FIG. 3 illustrates another example of an apparatus for interpolating between a first and a second signal.

An apparatus 300 for interpolating between a first and a second signal is illustrated in FIG. 3. The apparatus 300 comprises a plurality of interpolation cells 320-1, 320-2, . . . , 320-n that are coupled to a common node 330. A capacitance (e.g. a load capacitor 331) is present at the common node (e.g., the load capacitor 331 is coupled to the plurality of interpolation cells 320-1, 320-2, . . . , 320-n).

In the following, only the structure of the interpolation cell 320-1 of the plurality of interpolation cells 320-1, 320-2, . . . , 320-n is described in detail. It is evident that the other interpolation cells of the plurality of interpolation cells 320-1, 320-2, . . . , 320-n may have the same structure.

The interpolation cell 320-1 comprises a first pull-up/down path 350 comprising a first plurality of transistors coupled between the first potential 301 and the second potential 302. The first pull-up/down path 350 is configured to couple the common node 330 to one of the first potential 301 and the second potential 302 if the selection signal 311-1 indicates a first state. The selection signal 311-1 is received from a control circuit (not illustrated) of the apparatus 300.

The interpolation cell 320-1 comprises a second pull-up/down path 360 comprising a second plurality of transistors coupled between the first potential 301 and the second potential 302. The second pull-up/down path 360 is configured to couple the common node 330 to one of the first potential 301 and the second potential 302 if the selection signal 311-1 indicates a different second state.

The first pull-up/down path 350 comprises a first transistor stack 351 of a first conductivity type (e.g. n-channel) which is coupled between the first potential 301 and a first node 353. The first transistor stack 351 is configured to receive the leading one 303 of the first signal and the second signal, the trailing one 304 of the first signal and the second signal, and the inverted selection signal 311-1' (generated by the inverter 312 based on the selection signal 311-1) at respective transistor control terminals of the first transistor stack 351 (e.g. at respective gate terminals of the transistors forming the first transistor stack).

The first pull-up/down path 350 additionally comprises a second transistor stack 352 of a different second conductivity type (e.g. p-channel) which is coupled between the second potential 302 and the first node 353. The second transistor stack 352 is configured to receive the leading one 303 of the first signal and the second signal, the trailing one 304 of the first signal and the second signal, and the selection signal 311-1 at respective transistor control terminals of the second transistor stack 352 (e.g. at respective gate terminals of the transistors forming the second transistor stack).

The second pull-up/down path 360 comprises a third transistor stack 361 of the first conductivity type which is coupled between the first potential 301 and a second node 363. The third transistor stack 361 is configured to receive a third signal 305, the leading one 303 of the first signal and the second signal, and the selection signal 311-1 at respective transistor control terminals of the third transistor stack 361 (e.g. at respective gate terminals of the transistors forming the third transistor stack).

The second pull-up/down path 360 additionally comprises a fourth transistor stack 362 of the second conductivity type which is coupled between the second potential 302 and the second node 363. The fourth transistor stack 362 is configured to receive a fourth signal 306, the leading one 303 of the first signal and the second signal, and the inverted selection signal 311-1' at respective transistor control terminals of the fourth transistor stack 362 (e.g. at respective gate terminals of the transistors forming the fourth transistor stack).

The first node 353 and the second node 363 are coupled to the common node 330, respectively.

The third signal 305 may, e.g., be a constant third potential (e.g. $V_{cc}$), and the fourth signal 306 may be a constant fourth potential (e.g. $V_{ss}$). With the first signal and the second signal being oscillation signals, the third signal and the fourth signal may alternatively be an oscillation signal that leads the leading one 303 of the first signal and the second signal by a fraction of the oscillation period of the first signal. Using the oscillation signal as the third and fourth signal instead of the constant third and fourth potentials may equalize charge injection effects within the interpolation cell 320-1 and, hence, increase the static linearity of the apparatus 300.

In the following the operation of the apparatus 300 will be exemplarily described. It is assumed that the selection signal 311-1 is high in order to indicate that the interpolation cell 320-1 shall switch to coupling the common node 330 to the second potential 302/the first potential 301 in response to a transition of the leading one 303 of the first signal and the second signal from the first signal level to the second signal level, and vice versa. The selection signal 311-1 is low in order to indicate that the interpolation cell 320-1 shall switch to coupling the common node 330 to the second potential 302/the first potential 301 in response to a transition of the trailing one 304 of the first signal and the second signal from the first signal level to the second signal level, and vice versa.

If the selection signal 311-1 is low, the second pull-up/down path 360 is de-activated since the innermost transistors of the second pull-up/down path 360 (which receive selection signal 311-1 and the inverted selection signal 311-1', respectively) are in a non-conductive state. On the other hand, the first pull-up/down path 350 is activated since the innermost transistors of the first pull-up/down path 350 (which receive selection signal 311-1 and the inverted selection signal 311-1', respectively) are in a conductive state. That is, the common node is driven by the first pull-up/down path 350, if the selection signal 311-1 is low.

When the leading one 303 and the trailing one 304 of the first signal and the second signal are both high (i.e. are at the same first signal level), the two uppermost transistors of the second transistor stack 352 are in a non-conductive state, whereas the two lowermost transistors of the first transistor stack 351 are in a conductive state. Accordingly, the common node 330 is coupled to the first potential 301.

When the leading one 303 of the first signal and the second signal changes from high to low, the lowermost transistor of the first transistor stack 351 changes to the non-conductive state, whereas the uppermost transistor of the second transistor stack 352 changes to the conductive state. As long as the trailing one 304 of the first signal and the second signal stays high, the middle transistor of the first transistor stack 351 remains in the conductive state and the middle transistor of the second transistor stack 352 remains in the non-conductive state. That is, the common node 330 is decoupled from both the first potential 301 and the second potential 302 if the first and second signal have different signal levels.

As soon as also the trailing one 304 of the first signal and the second signal changes from high to low, the middle transistor of the first transistor stack 351 changes to the non-conductive state and the middle transistor of the second transistor stack 352 changes to the conductive state. Accordingly, the common node 330 is coupled to the second potential 302. That is, the interpolation cell 320-1 is responsive to the transition of the signal level of the trailing one 304 of the first signal and the second signal.

As long as the leading one 303 and the trailing one 304 of the first signal and the second signal are both low (i.e. are at the same second signal level), the two uppermost transistors of the second transistor stack 352 are in the conductive state, whereas the two lowermost transistors of the first transistor stack 351 are in the non-conductive state. Accordingly, the common node 330 remains coupled to the second potential 302.

When the leading one 303 of the first signal and the second signal changes back from low to high, the lowermost transistor of the first transistor stack 351 changes to the conductive state, whereas the uppermost transistor of the second transistor stack 352 changes to the non-conductive state. As long as the trailing one 304 of the first signal and the second signal stays low, the middle transistor of the first transistor stack 351 remains in the non-conductive state and the middle transistor of the second transistor stack 352 remains in the conductive state. That is, the common node 330 is again decoupled from both the first potential 301 and the second potential 302.

As soon as also the trailing one 304 of the first signal and the second signal changes back from low to high, the middle transistor of the first transistor stack 351 changes to the conductive state and the middle transistor of the second transistor stack 352 changes to the non-conductive state. Accordingly, the common node 330 is coupled to the first potential 301. That is, the interpolation cell 320-1 is responsive to the transition of the signal level of the trailing one 304 of the first signal and the second signal from high to low, and vice versa.

If the selection signal 311-1 is high, the first pull-up/down path 350 is de-activated since the innermost transistors of the first pull-up/down path 350 (which receive selection signal 311-1 and the inverted selection signal 311-1', respectively) are in a non-conductive state. On the other hand, the second pull-up/down path 360 is activated since the innermost transistors of the second pull-up/down path 360 (which receive selection signal 311-1 and the inverted selection signal 311-1', respectively) are in a conductive state. That is, the common node is driven by the second pull-up/down path 360, if the selection signal 311-1 is high.

When the leading one 303 and the trailing one 304 of the first signal and the second signal are both high (i.e. are at the same first signal level), the middle transistor of the third transistor stack 361 is in a conductive state, whereas the middle transistor of the fourth transistor stack 362 is in a non-conductive state. If the third signal 305 is a constant third potential (e.g. $V_{cc}$) and the fourth signal 306 is a constant fourth potential (e.g. $V_{ss}$), also the lower-most transistor of the third transistor stack 361 and the uppermost transistor of the fourth transistor stack 362 are in a conductive state. If the third signal 305 and the fourth signal 306 are an oscillation signal, the oscillation signal may be selected such that it leads and partly overlaps with the leading one 303 of the first signal and the second signal (e.g. the oscillation signal may lead the leading one 303 of the first signal and the second signal by 45°). Accordingly, the common node 330 is coupled to the first potential 301.

When the leading one 303 of the first signal and the second signal changes from high to low, the middle transistor of the third transistor stack 361 changes to the non-conductive state, whereas the middle transistor of the fourth transistor stack 362 changes to the conductive state. The lowermost transistor of the third transistor stack 361 and the uppermost transistor of the fourth transistor stack 362 remain in the conductive state. Accordingly, the common node 330 is coupled to the second potential 302 in response to the transition of the signal level of the leading one 303 of the first signal and the second signal from high to low.

As long as the leading one 303 of the first signal and the second signal and the fourth signal 306 are both low, the two uppermost transistors of the fourth transistor stack 362 are in the conductive state, whereas the middle transistor of the third transistor stack 361 is in the non-conductive state. Accordingly, the common node 330 remains coupled to the second potential 302. If the fourth signal 306 is the constant fourth potential, the uppermost transistor of the fourth transistor stack 362 is always in the conductive state. That is, the common node 330 remains coupled to the second potential 302 as long as the leading one 303 of the first signal and the second signal is low.

If the fourth signal 306 is the oscillation signal (leading the leading one 303 of the first signal and the second signal), the uppermost transistor of the fourth transistor stack 362 is in the conductive state when the oscillation signal is low. That is, the common node 330 remains coupled to the second potential 302 as long as the oscillation signal and the leading one 303 of the first signal and the second signal are both low. As soon as the oscillation signal goes back to high, the common node 330 is decoupled from the second potential 302 (and remains decoupled from the first potential 301 since the middle transistor of the third transistor stack 361 remains in the non-conductive state).

As soon as the leading one 303 of the first signal and the second signal changes back from low to high, the middle transistor of the third transistor stack 361 changes to the conductive state and the middle transistor of the fourth transistor stack 362 changes to the non-conductive state. Accordingly, the common node 330 is coupled again to the first potential 301. That is, the interpolation cell 320-1 is responsive to the transition of the signal level of the leading one 303 of the first signal and the second signal from high to low, and vice versa.

By selectively coupling the common node 330 to one of the first potential 301 and the second potential 302 via the plurality of interpolation cells 320-1, 320-2, ..., 320-n and in response in response to a transition of either the leading 303 or the trailing one 304 of the first signal and the second signal, the load capacitor 331 may be charged faster or slower. As a result, an almost linear variation of the output delay with code (i.e. the control word on which the selection signal 311-1 is based) may be achieved. Additionally, the apparatus 300 may allow a contention-free operation, i.e., times when conductive paths of the apparatus 300 of different conductivity are both on (and shorting the first and the second potentials 301, 302) may be avoided. Also, the apparatus 300 may enable to keep the load capacitor 331 at a defined potential without any additional circuitry, when no interpolation is taking place (i.e. when the first and the second signal are at the same signal level). The apparatus 300 may, hence, allow phase interpolation with low dynamic errors, low INL, low power dissipation and low noise.

Figure 4A:
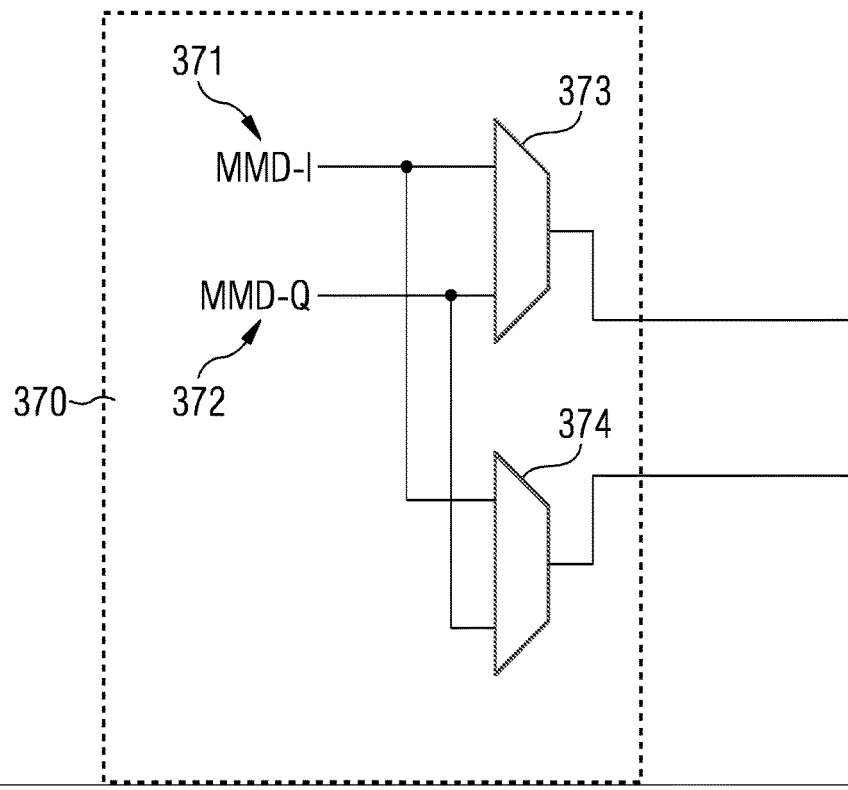
FIG. 4 illustrates still another example of an apparatus for interpolating between a first and a second signal.
Figure 4B:
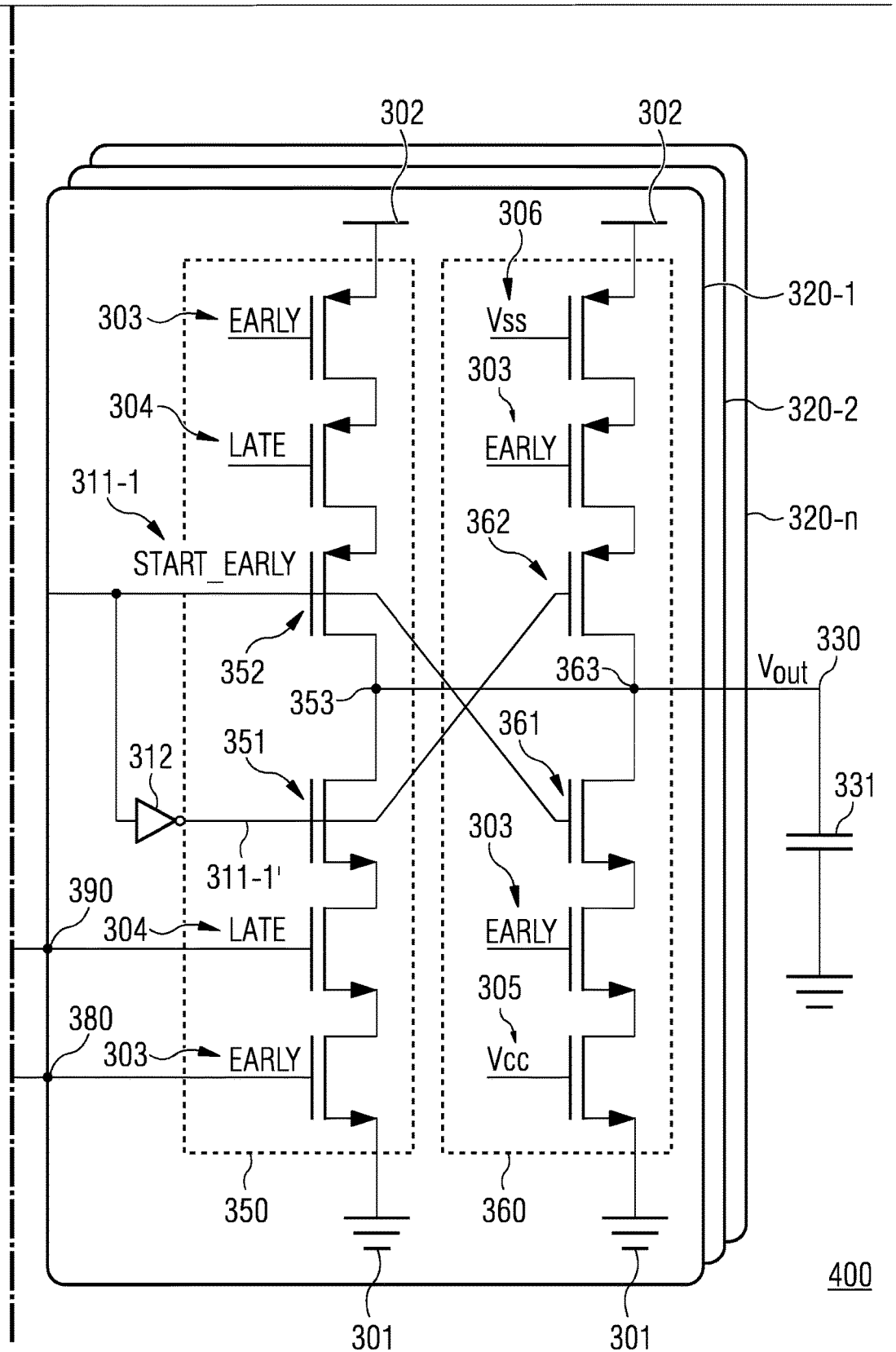

FIG. 4 illustrates another apparatus 400 for interpolating between a first and a second signal. Apparatus 400 is similar to apparatus 300 illustrated in FIG. 4. However, the apparatus 400 additionally comprises a selection circuit 370 for selecting the leading one 303 and the trailing one 304 of the first signal and the second signal, and for supplying them to respective input nodes of the plurality of interpolation cells 320-1, 320-2, ..., 320-n.

The selection circuit 370 is configured to select the leading one 303 of the first signal 371 and the second signal 372, and to supply it to a first input node 380 of the one interpolation cells 320-1 of the plurality of interpolation cells 320-1, 320-2, ..., 320-n. The first input node 380 is dedicated to the leading one 303 of the first signal and the second signal. Further, the selection circuit 370 is configured to select the trailing one 304 of the first signal 370 and the second signal 371, and to supply it to a second input node 390 of the one interpolation cells 320-1 of the plurality of interpolation cells 320-1, 320-2, ..., 320-n. The second input node 390 is dedicated to the trailing one 304 of the first signal 370 and the second signal 371.

As indicated in FIG. 4, the selection circuit 370 may, e.g., comprise a plurality (e.g. two) of multiplexers 373, 374 for selecting the leading one 303 and the trailing one 304 among the first signal 371 and the second signal 372.

The first signal 371 and the second signal 372 may, e.g., be generated by a MMD or any other frequency divider circuit based on a LO signal. In general, the first signal 371 and the second signal 372 may be generated by any circuit able to provide two signals that are shifted in time.

In other words, phase interpolators according to the proposed architecture may interpolate between two signals that have different 0-$V_{cc}$ transition times. For example, in a DTC, the phase interpolator may be preceded by an MMD which has two outputs MMDI and MMDQ with delay difference of $\pm T_{LO}/2$ (e.g. 62.5 ps for LO signal of 8 GHz that is input into the MMD). Which interpolator input leads the other can generally change over time according to DTC modulation or operating region. "EARLY" may be the leading input signal, and "LATE" may be the lagging (trailing) signals at a specific point in time. The proposed feed-forward linearization with the Early-Late DCEI exploits the knowledge of the input signal's temporal order to linearize the interpolation.

As indicated in FIGS. 2a to 4, the Early-Late DCEI consists of an array of interpolation cells that can be activated when the EARLY signal arrives, or when the LATE signal arrives. Depending on how many cells are activated EARLY vs. LATE, the output may change faster or slower, thus giving an almost-linear variation of output delay with code (number of cells in each mode). This principle of the Early-Late DCEI is illustrated in FIGS. 2a and 2b. For example, a total of 128 cells are shorted and drive a common capacitive load. Depending on the START_EARLY signal of each cell, the cell can be activated when the EARLY signal arrives or when LATE signal arrives. Depending on how many cells start Early, the output can charge faster or slower giving an almost linear variation of delay with code. The example of FIG. 3 has ports dedicated to the EARLY/LATE signals.

In some examples, the selection of the EARLY signal may be done with a multiplexer (MUX) in front of the interpolator that dynamically connects the EARLY/LATE signals to the dedicated EARLY/LATE ports.

The proposed Early-Late DTC may enable contention-free operation, thus linearizing the interpolation. This may allow very linear operation—much more linear than alternative contention DCEI architectures. Furthermore, the proposed Early-Late DCEI may have a constant current consumption, resulting in very robust operation with practical LDOs and very small dynamic errors. Also, the Early-Late DCEI may enable high-resolution, symmetrical forward- and backward interpolation on both rising and falling edges with very small static and dynamic errors.

As mentioned before, which MMD output is EARLY and which is LATE may depend on modulation. FIG. 4 shows one possible implementation where two MUXes at the MMD output divert the MMD outputs MMDI and MMDQ to the EARLY and LATE inputs of the DCEI. The MUXes may enable a selection of EARLY/LATE signals for the physical pins of the interpolation cell, which are dedicated to EARLY or LATE.

Alternatively, at least three pull-up/down paths may be provided in each interpolation cell, wherein only the relevant one is activated. For example, the at least one interpolation cell 320-1 of the plurality of interpolation cells 320-1, 320-2, ..., 320-n may comprise first to third pull-up/down paths (not illustrated), each comprising a plurality of transistors coupled between the first potential 301 and the second potential 302. Additionally, the interpolation cell 320-1 may comprise a cell control circuit (not illustrated) configured to selectively control the first pull-up/down path to couple the common node 330 to one of the first potential 301 and the second potential 302 if the selection signal 311-1 indicates a first state. The cell control circuit may be further configured to selectively control one of the second and the third pull-up/down path to couple the common node 330 to one of the first potential 301 and the second potential 302 if the selection signal 311-1 indicates a different second state.

The first pull-up/down path may comprise a first transistor stack of the first conductivity type which is coupled to the first potential, wherein the first transistor stack is configured to receive the first signal and the second signal at respective transistor control terminals of the first transistor stack. Further, the first pull-up/down path may comprise a second transistor stack of the different second conductivity type which is coupled to the second potential, wherein the second transistor stack is configured to receive the first signal and the second signal at respective transistor control terminals of the second transistor stack. For example, the first and second transistor stacks may be similar to the first and second transistor stacks 351, 352 illustrated in FIGS. 3 and 4, except for directly supplying the first and the second signal to the respective transistor control terminals instead of supplying the previously selected leading one 303 and trailing one 304 of the first signal and the second signal.

The second pull-up/down path may comprise a third transistor stack of the first conductivity type which is coupled to the first potential, wherein the third transistor stack is configured to receive a third signal and the first signal at respective transistor control terminals of the third transistor stack. The second pull-up/down path may additionally comprise a fourth transistor stack of the second conductivity type which is coupled to the second potential, wherein the fourth transistor stack is configured to receive a fourth signal and the first signal at respective transistor control terminals of the fourth transistor stack.

The third pull-up/down path may comprise a fifth transistor stack of the first conductivity type which is coupled to the first potential, wherein the fifth transistor stack is configured to receive the third signal and the second signal at respective transistor control terminals of the fifth transistor stack. Further, the third pull-up/down path may comprise a sixth transistor stack of the second conductivity type which is coupled to the second potential, wherein the sixth transistor stack is configured to receive the fourth signal and the second signal at respective transistor control terminals of the sixth transistor stack.

That is, the second pull-up/down path 360 illustrated in FIG. 3 may be replaced by two pull-up/down path, wherein one of the two pull-up/down path is dedicated to the first signal being earlier than the second signal, and the other of the two pull-up/down path is dedicated to the second signal being earlier than the first signal. In this exemplary implementation, the previous selection of the leading one and the trailing one of the first signal and the second signal may be omitted.

Based on the selection signal and information on the temporal order of the first and the second signal, the cell control circuit may select one the first to third pull-up/down paths for driving the common node. For example, the cell control circuit may comprise a first pair of selection transistors (e.g. a transistor of the first conductivity type and a transistor of the second conductivity type) configured to couple the common node to the second pull-up/down path if the selection signal indicates the second state and if the first signal leads the second signal. Otherwise, the cell control circuit may decouple the common node from the second pull-up/down path. Further, the cell control circuit may comprise a second pair of selection transistors (e.g. a transistor of the first conductivity type and a transistor of the second conductivity type) configured to couple the common node to the third pull-up/down path if the selection signal indicates the second state and if the second signal leads the first signal. Otherwise, the cell control circuit may decouple the common node from the third pull-up/down path.

In this way, an apparatus for interpolating between the first and the second signal may be achieved with the same functionality as the apparatuses 300 and 400. However, the previous selection of the leading one and the trailing one of the first signal and the second signal may be omitted.

Figure 5:
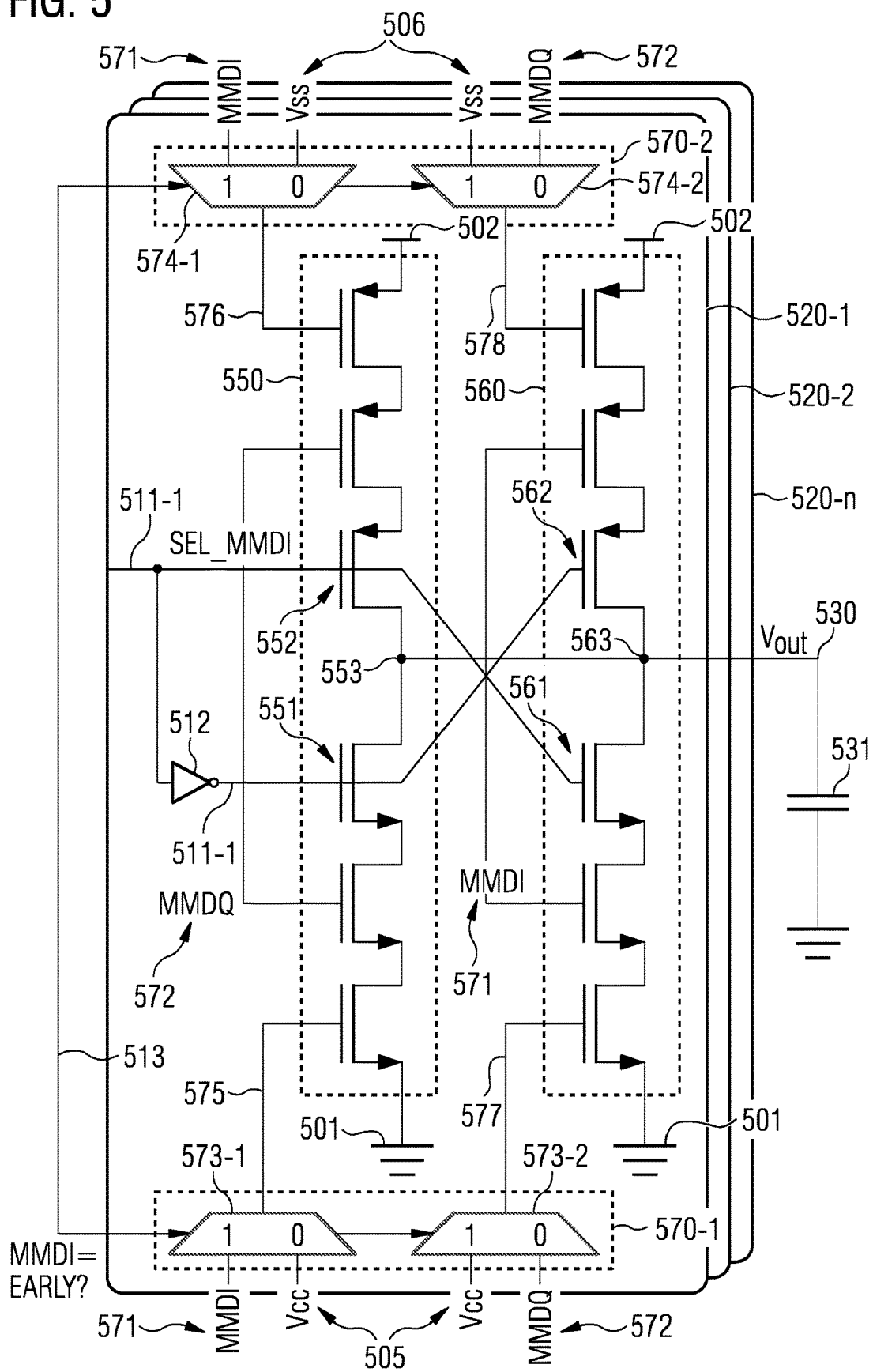
FIG. 5 illustrates a further example of an apparatus for interpolating between a first and a second signal.

In FIG. 5, a further apparatus 500 for interpolating between a first and a second signal is illustrated. The apparatus 500 is similar in functionality to the apparatuses 300 and 400 illustrated in FIGS. 3 and 4. However, the apparatus 500 comprises an internal selection logic for selecting EARLY/LATE signals, and for reconfiguring the DCEI cell. This may result in still smaller dynamic and static errors.

Again, the apparatus 500 comprises plurality of interpolation cells 520-1, 520-2, ..., 520-n coupled to a common node 530 of the apparatus. A load capacitor 531 may be coupled to the common node 530.

At least the one interpolation cell 520-1 of the plurality of interpolation cells 520-1, 520-2, ..., 520-n again comprises a first pull-up/down path 550 comprising a first plurality of transistors coupled between the first potential 501 (e.g. $V_{ss}$ or ground) and the second potential 502 (e.g. $V_{cc}$). The first pull-up/down path 550 is configured to couple the common node 530 to one of the first potential 501 and the second potential 502 if the selection signal 511-1 indicates a first state. The interpolation cell 520-1 further comprises a second pull-up/down path 560 comprising a second plurality of transistors coupled between the first potential 501 and the second potential 502. The second pull-up/down path 560 is configured to couple the common node 530 to one of the first potential 501 and the second potential 502 if the selection signal 511-1 indicates a different second state. It is evident that the other interpolation cells of the plurality of interpolation cells 520-1, 520-2, ..., 520-n may have the same structure.

The interpolation cell 520-1 additionally comprises a first selection circuit 570-1 configured to supply, based on a timing signal 513 that indicates the temporal order of the first signal 571 and the second signal 572, either the first signal 571 or a third signal 505 as a first selected signal 575 to the first pull-up/down path 550. The interpolation cell 520-1 also comprises a second selection circuit 570-2 configured to supply, based on the timing signal 513, either the first signal 571 or a fourth signal 506 as a second selected signal 576 to the first pull-up/down path 550.

For example, the first selection circuit 570-1 may comprise a first multiplexer 573 configured to select, based on the timing signal 513, either the first signal 571 or the third signal 505 as the first selected signal 575. The second selection circuit 570-2 may comprise a second multiplexer 574 configured to select, based on the timing signal 513, either the first signal 571 or the fourth signal 506 as the second selected signal 576.

The first selection circuit 570-1 may be further configured to supply, based on the timing signal 513, either the second signal 572 or the third signal 505 as a third selected signal 577 to the second pull-up/down path 560. The second selection circuit 570-2 may be further configured to supply, based on the timing signal 513, either the second signal 572 or the fourth signal 506 as a fourth selected signal 578 to the second pull-up/down path 560.

In some examples, the first selection circuit 570-1 may comprise a third multiplexer 573-2 configured to select, based on the timing signal 513, either the second signal 572 or the third signal 505 as the third selected signal 577. The second selection circuit 570-2 may comprise a fourth multiplexer 574-2 configured to select, based on the timing signal 513, either the second signal 572 or the fourth signal 506 as the fourth selected signal 578.

The first pull-up/down path 550 comprises a first transistor stack 551 of a first conductivity type (e.g. n-channel) which is coupled between the first potential 501 and a first node 553. The first transistor stack 551 is configured to receive the second signal 572, the first selected signal 575 and the inverted selection signal 511-1' (generated by the inverter 512 based on the selection signal 511-1) at respective transistor control terminals of the first transistor stack 551 (e.g. at respective gate terminals of the transistors forming the first transistor stack).

The first pull-up/down path 550 additionally comprises a second transistor stack 552 of a different second conductivity type (e.g. p-channel) which is coupled between the second potential 502 and the first node 553. The second transistor stack 552 is configured to receive the second signal 572, the second selected signal 576 and the selection signal 511-1 at respective transistor control terminals of the second transistor stack 552 (e.g. at respective gate terminals of the transistors forming the second transistor stack).

The second pull-up/down path 560 comprises a third transistor stack 561 of the first conductivity type which is coupled between the first potential 501 and a second node 563. The third transistor stack 561 is configured to receive the first signal 571, the third selected signal 577 and the selection signal 511-1 at respective transistor control terminals of the third transistor stack 561 (e.g. at respective gate terminals of the transistors forming the third transistor stack).

The second pull-up/down path 560 additionally comprises a fourth transistor stack 562 of the second conductivity type which is coupled between the second potential 502 and the second node 563, wherein the fourth transistor stack 562 is configured to receive the first signal 571, the fourth selected signal 578 and the inverted selection signal 511-1' at respective transistor control terminals of the fourth transistor stack 562 (e.g. at respective gate terminals of the transistors forming the fourth transistor stack).

The first node 553 and the second node 563 are coupled to the common node 530, respectively.

As described above with respect to FIG. 3, the third signal 505 may, e.g., be a constant third potential (e.g. $V_{cc}$), and the fourth signal 506 may be a constant fourth potential (e.g. $V_{ss}$). With the first signal 571 and the second signal 572 being oscillation signals, the third signal 505 and the fourth signal 506 may alternatively be an oscillation signal that leads the leading one of the first signal 571 and the second signal 572 by a fraction of the oscillation period of the first signal 571. Using the oscillation signal as the third and fourth signal 505, 506 instead of the constant third and fourth potentials may equalize charge injection effects within the interpolation cell 520-1 and, hence, increase the static linearity of the apparatus 500.

As discussed above, the selection which of the first signal 571 and the second signal 572 is leading/trailing the other one is done by the first and the second selection circuits 570-1 and 570-2 within the interpolation cell 520-1. Accordingly, the individual transistor stacks of the first and the second pull-up/down paths 550, 560 may be reconfigured. This is explained in the following.

The selection signal 511-1 is assumed to be high in order to indicate that the interpolation cell 520-1 shall switch to coupling the common node 530 to the second potential 502/the first potential 501 in response to a transition of the first signal 571 from the first signal level to the second signal level, and vice versa. The selection signal 511-1 is low in order to indicate that the interpolation cell 520-1 shall switch to coupling the common node 530 to the second potential 502/the first potential 501 in response to a transition of the second signal 572 from the first signal level to the second signal level, and vice versa.

The timing signal 513 is assumed to be high, if the first signal 571 leads the second signal 572. If the second signal 572 leads the first signal 571, the timing signal 513 is low.

If the first signal 571 leads the second signal 572, the first selection circuit 570-1, hence, supplies the first signal 571 as first selected signal 575 to the first transistor stack 551 and supplies the third signal 505 as third selected signal 577 to the third transistor stack 561. The second selection circuit 570-2 supplies the first signal 571 as second selected signal 576 to the second transistor stack 552 and supplies the fourth signal 506 as fourth selected signal 578 to the third transistor stack 561.

That is, the first transistor stack 551 receives the second signal 572, the first signal 571 and the inverted selection signal 511-1' at its respective transistor control terminals. The second transistor stack 552 receives the second signal 572, the first signal 571 and the selection signal 511-1 at its respective transistor control terminals. The third transistor stack 561 receives the first signal 571, the third signal 505 and the selection signal 511-1 at its respective transistor control terminals. The fourth transistor stack 562 receives the first signal 571, the fourth signal 506 and the inverted selection signal 511-1' at its respective transistor control terminals.

If the second signal 572 leads the first signal 571, the first selection circuit 570-1 supplies the third signal 505 as first selected signal 575 to the first transistor stack 551 and supplies the second signal 572 as the third selected signal 577 to the third transistor stack 561. The second selection circuit 570-2 supplies the fourth signal 506 as second selected signal 576 to the second transistor stack 552 and supplies the second signal 572 as fourth selected signal 578 to the third transistor stack 561.

That is, the first transistor stack 551 receives the second signal 572, the third signal 505 and the inverted selection signal 511-1' at its respective transistor control terminals. The second transistor stack 552 receives the second signal 572, the fourth signal 506 and the selection signal 511-1 at its respective transistor control terminals. The third transistor stack 561 receives the first signal 571, the second signal 572 and the selection signal 511-1 at its respective transistor control terminals. The fourth transistor stack 562 receives the first signal 571, the second signal 572 and the inverted selection signal 511-1' at its respective transistor control terminals.

Hence, the first and second selection circuits 570-1, 570-2 configure the first and second pull-up/down paths 550, 560 such that the first and the second transistor stacks 551, 552 receive the leading one and the trailing one of the first signal 571 and the second signal 572, if the first signal 571 leads the second signal 572. The third transistor stack 561 receives the third signal 505 and the first signal 571 (i.e. the leading one of the first signal 571 and the second signal 572). The fourth transistor stack 562 receives the fourth signal 506 and the first signal 571 (i.e. the leading one of the first signal 571 and the second signal 572).

If the second signal 572 leads the first signal 571, the first and second selection circuits 570-1, 570-2 configure the first and second pull-up/down paths 550, 560 such that the third and the fourth transistor stacks 561, 562 receive the leading one and the trailing one of the first signal 571 and the second signal 572. The first transistor stack 551 receives the third signal 572 and the second signal 572 (i.e. the leading one of the first signal 571 and the second signal 572). The second transistor stack 552 receives the fourth signal 506 and the second signal 572 (i.e. the leading one of the first signal 571 and the second signal 572).

The interpolation cell 520-1 has, hence, in all cases the same configuration like the interpolation cell 320-1 illustrated in FIGS. 3 and 4. Therefore, the interpolation cell 520-1 has the same functionality as the interpolation cell 320-1 illustrated in FIGS. 3 and 4 since also the selection signal 511-1 indicates if the interpolation cell 520-1 is to be responsive to the leading one or the trailing one of the first and the second signal 571, 572.

The apparatus 500 may due to its cell-internal selection of the leading one and the trailing one among the first signal 572 and the second signal 572 provide still smaller dynamic and static errors compared to the apparatuses 300 and 400. This will become evident from the following example.

Assuming that the first and the second signal are provided by an MMD and that the apparatus comprises 128 interpolation cells (of course, any other number of cells may be used instead), the following happens in apparatuses 300 and 400 at an MMD transition point (e.g. between code words 127 and 128):

1) at code word 127: the first signal is leading the second signal, and 127 interpolation are responsive to the trailing one of the first and the second signal (i.e. responsive to the second signal); and
2) at code word 128: the second signal is now leading the first signal (since the MMD changes the temporal order of the first and second signals after each 128 codes), and all 128 interpolation cells are responsive to the leading one of the first and the second signal (i.e. responsive to the second signal).

At the transition from code word 127 to 128, the modulation changes so that, e.g., the output of the selection circuit 370 in FIG. 4 will swap. Additionally, 127 interpolation cells change their state as they are now responsive to the leading one of the first and the second signal instead of the trailing one. This may generate dynamic errors due to the current drawn from the power supply of the apparatus in order to change the state of the interpolation cells. Furthermore, also static errors due to mismatches between the interpolation cells may occur. While this may be acceptable for less demanding applications, the generated errors may be unacceptable for more demanding applications (e.g. a polar transmitter for LTE).

The apparatus 500 may avoid the above issues. Here the outputs of the MMD are directly coupled to the interpolation cells. The selection which of the first and the second signal is early is done within the respective interpolation cell. At the transition from code word 127 to 128 only one of the interpolation cells needs to change its state (i.e. the state indicated by the selection signal 511-1 changes only for one of the interpolation cells)—not 127 interpolation cells. Only the configuration of the first and second selection circuits 570-1, 570-2 in the interpolation cells needs to be changed. However, this is not an issue since the lower-most transistor in each of the first and the third transistor stacks 551, 561 as well as the uppermost transistor in each of the second and the fourth transistor stacks 552, 562 simply pre-charge the interpolation cell. The timing of the interpolation cell is determined by the respective middle transistor in each of the first to fourth transistor stacks 551, 552, 561, 562.

Also, the plurality of interpolation cells 520-1, 520-2, . . . , 520-n do not need input nodes specifically dedicated to the leading one or the trailing one of the first signal and the second signal, as the interpolation cell is re-configured dynamically.

Figure 6A:
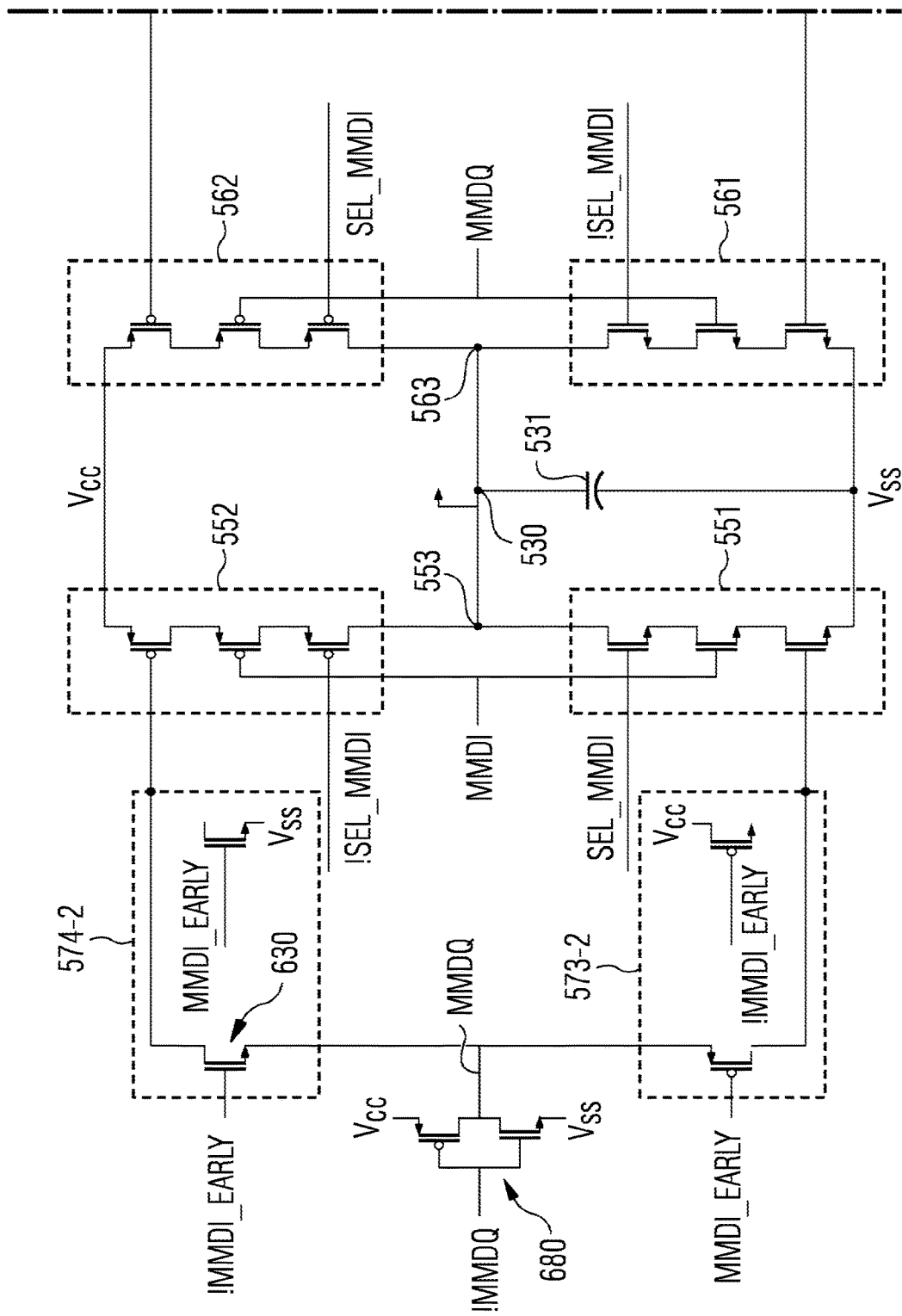
FIG. 6 illustrates an example of an implementation of the apparatus illustrated in FIG. 5.
Figure 6B:
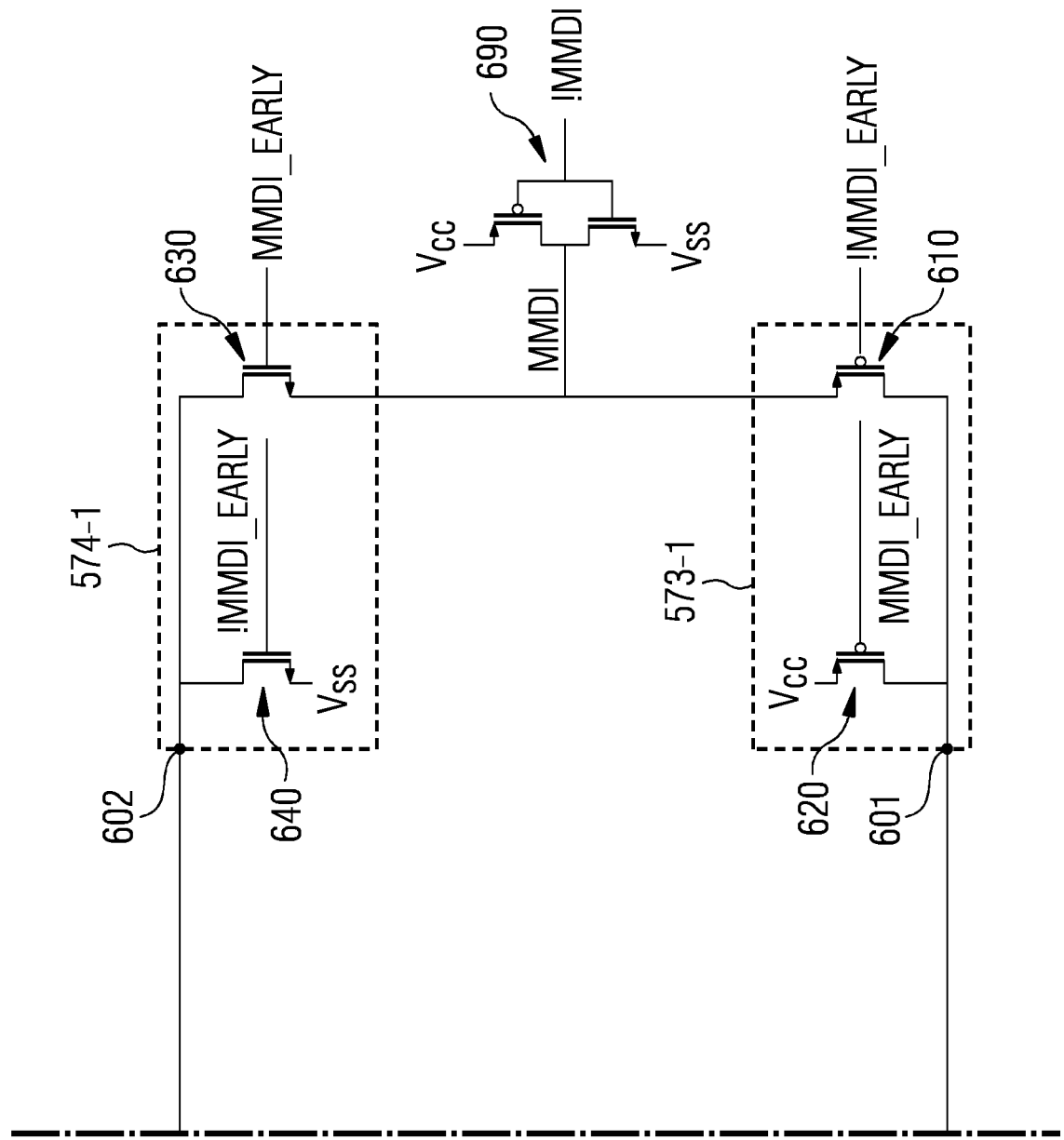

An exemplary implementation of the apparatus 500 is illustrated in FIG. 6. The apparatus 500 comprises again the first to fourth transistor stacks 551, 552, 561, 562 and the common node 530. The capacitance present at the common node 530 is illustrated by way of example by the load capacitor 531. The load capacitor 531 is optional. For illustrative purposes only, the common node 530 and load capacitor 531 are shown to be within an interpolation cell. It is evident that the common node 530 and load capacitor 531 are located outside the plurality of interpolation cells.

FIG. 6 illustrates a differential implementation of apparatus 500. The first and second input signals (MMDQ and MMDI) are supplied to the first to fourth multiplexers 573-1, 573-2, 574-1 and 574-2 by two inverters 680, 690 based on two MMD output signals (!MMDQ and !MMDI; a signal labelled "!XXXX" is the inverted one of the signal labelled "XXXX"), respectively. However, the inverters 680, 690 are optional and may be omitted or replaced by other elements (e.g. buffers) with appropriate adjustment of signal polarity. Further, any other element than an MMD may provide the signals. The functionality of the interpolation cell is identical to the one described above in connection with FIG. 5.

FIG. 6 further illustrates an exemplary implementation of the first multiplexer 573 and the second multiplexer 574.

The first multiplexer 573-1 consists of a first transistor 610 and a second transistor 620 of the second conductivity type that are coupled in parallel to an output node 601 of the first multiplexer 573. The first transistor 610 is configured to receive the inverted timing signal (!MMDI_EARLY) at its control terminal (e.g. its gate terminal) and to receive the first signal (MMDI) at another terminal. The second transistor 620 is configured to receive the timing signal (MMDI_EARLY) at its control terminal (e.g. its gate terminal) and to receive the third signal ($V_{cc}$) at another terminal.

The second multiplexer 574-1 consists of a third transistor 630 and a fourth transistor 640 of the first conductivity type that are coupled in parallel to an output node 602 of the second multiplexer 574. The third transistor 630 is configured to receive the timing signal (MMDI_EARLY) at its control terminal (e.g. its gate terminal) and to receive the first signal (MMDI) at another terminal. The fourth transistor is configured to receive the inverted timing signal (!MMDI_EARLY) at its control terminal (e.g. its gate terminal) and to receive the fourth signal ($V_{ss}$) at another terminal.

As indicated in FIG. 6, the third multiplexer 573-2 and the fourth multiplexer 574-2 may be constituted similar. For example, the third multiplexer 573-2 may be designed like the first multiplexer 573-1 but receive the second signal (MMDQ) instead of the first signal (MMDI). Furthermore, the inverted timing signal (!MMDI_EARLY) and the timing signal (MMDI_EARLY) may be swapped. Similarly, the fourth multiplexer 574-2 may be may be designed like the second multiplexer 574-1 but receive the second signal (MMDQ) instead of the first signal (MMDI). Again, the inverted timing signal (!MMDI_EARLY) and the timing signal (MMDI_EARLY) may be swapped.

Compared to conventional multiplexers, the above multiplexers may comprise a small number of transistors. Hence, a power consumption of the multiplexers may be reduced. However, the apparatus 500 is not limited to the illustrated types of multiplexers. Any type of multiplexer may be used.

In other words, apparatus 500 may be further beneficial compared to apparatuses 300 and 400. Here, the MMD outputs MMDI and MMDQ are connected directly to DCEI inputs. The selection which signal is EARLY and LATE is done with the MUXes at the bottom/top of the DCEI. When MMDI is EARLY the MUXes configure the left leg to have MMDQ-MMDI=LATE-EARLY, and the right leg MMDI-$V_{cc}$=EARLY-$V_{cc}$. When MMDI=LATE, then the MUXes give for the left leg MMDQ-$V_{cc}$=EARLY-$V_{cc}$, and for the right leg MMDI-MMDQ=LATE-EARLY. So in all cases the cells operates as described in connection with FIG. 3. The delay of the MUXes is not an issue since the lower transistors in FIGS. 5 and 6 simply control the cell, but the timing is determined by the timing of the middle nMOS transistor. The interpolation cell's input signal pins do not need a dedicated connection to the EARLY/LATE signal anymore, as they are reconfigured dynamically. Different types of MUXes may be used. FIG. 6 shows such an implementation. Other MUX architectures are also possible.

As indicated above, also a VERY_EARLY_MMD output may be used that is e.g. ~62.5 ps earlier than the earlier of MMDI and MMDQ (for an LO frequency of 8 GHz and a frequency of 2 GHz for MMDI and MMDQ). Such an output may be generated by the MMD. This VERY_EARLY signal may be connected to the MUXes at the bottom/top of FIGS. 5 and 6 instead of $V_{cc}/V_{ss}$. This modification may equalize the charge injection effects happening inside the DCEI and give very good static linearity.

In some applications, the relationship between MMDI phase and MMDQ phase (i.e. the phase relation between the first signal and the second signal) is fixed (e.g. true for a DTC used in PLL feedback or FMDLL). In this case, the circuits presented here may be used without MUXes (in general without a selection circuit) since it is a priori known which signal is EARLY and which is LATE.

In the circuits and apparatuses illustrated above, the branches have signals LATE-EARLY, and EARLY-$V_{cc}$. Other combinations are also possible (e.g. EARLY-LATE and EARLY-$V_{cc}$). For example, EARLY and LATE may be swapped in the left pull-up/down paths of FIGS. 3 to 6. Nevertheless, the illustrated arrangements may give the best characteristics (e.g. no range compression, limited sensitivity to parasitics etc.) While the examples above indicate a MMD as (DTC) coarse tuning stage in front of the Early-Late DCEI, any coarse tuning block that provides two signals for the phase interpolator may be used.

Generally speaking, some examples presented herein relate to a means for interpolating between a first and a second signal. The means comprises a plurality of cellular means coupled to a common node, and a means for supplying, based on a control word, a respective selection signal to the plurality of cellular means. At least one of the plurality of cellular means is configured to couple the common node to a first potential if the first signal and the second signal are both at a first signal level, couple the common node to a different second potential if the first signal and the second signal are both at a different second signal level, and decouple the common node from at least one of the first potential and the second potential if the first signal and the second signal are at different signal levels. Further, the at least one of the plurality of cellular means is configured to switch, based on a state indicated by the respective selection signal, to coupling the common node to the second potential in response to a transition of either the leading one or the trailing one of the first signal and the second signal from the first signal level to the second signal level.

The at least one of the plurality of cellular means may be further configured to switch, based on the state indicated by the respective selection signal, to coupling the common node to the first potential in response to a transition of either the leading one or the trailing one of the first signal and the second signal from the second signal level to the first signal level.

The means for interpolating between a first and a second signal may be implemented by an apparatus for interpolating between a first and a second signal described above or below (e.g. FIG. 1). The plurality of cellular means may be implemented by a plurality of interpolation cells described above or below (e.g. FIG. 1). The means for supplying a respective selection signal to the plurality of cellular means may be implemented by a control circuit described above or below (e.g. FIG. 1).

Some examples relate to a DTC comprising an apparatus for interpolating between a first and a second signal according to one or more aspects of the proposed architecture or one or more examples described above.

Figure 7:
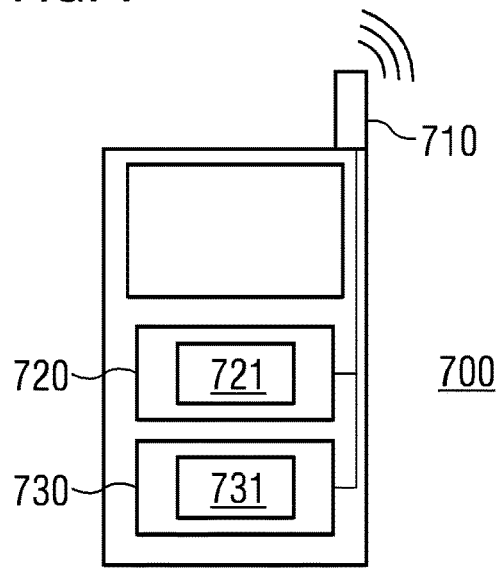
FIG. 7 illustrates an example of a user equipment comprising an apparatus for interpolating between a first and a second signal.

An example of an implementation using a DTC according to one or more aspects of the proposed architecture or one or more examples described above is illustrated in FIG. 7. FIG. 7 schematically illustrates an example of a mobile device 700 (e.g. mobile phone, smartphone, tablet-computer, or laptop) comprising a DTC according to an example described herein. For example, a transmitter 720 may comprise the DTC 721. Further, a receiver 730 may comprise the DTC 731. An antenna element 710 of the mobile device 700 may be coupled to the transmitter 720, or the receiver 730. To this end, mobile device may be provided enabling low out-of-band noise.

A transmitter comprising DTC according to one or more aspects of the proposed architecture or one or more examples described above may have a dynamic error which is much lower than competing architectures. Additionally, a transmitter comprising DTC according to one or more aspects of the proposed architecture or one or more examples described above may achieve a low INL, low power dissipation and low noise.

Figure 8:
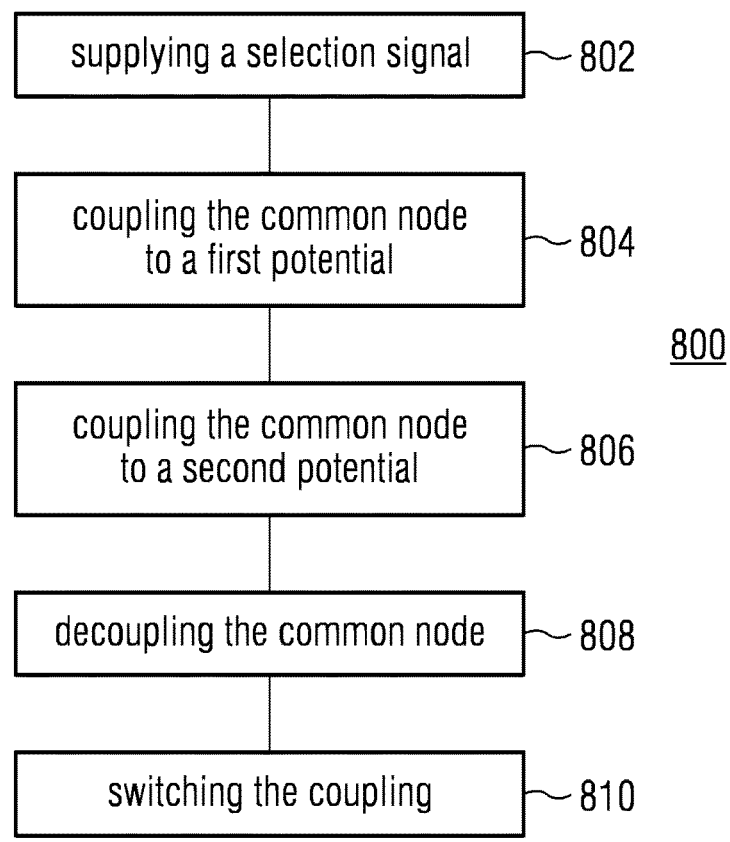
FIG. 8 illustrates a flowchart of an example of a method for interpolating between a first and a second signal.

An example of a method 800 for controlling an apparatus for interpolating between a first and a second signal is illustrated by means of a flowchart in FIG. 8. The method 800 comprises supplying 802, based on a control word, a respective selection signal to the plurality of interpolation cells. Further, the method 800 comprises coupling 804, by at least one of the plurality of interpolation cells, the common node to a first potential if the first signal and the second signal are both at a first signal level. The method 800 also comprises coupling 806, by the at least one of the plurality of interpolation cells, the common node to a different second potential if the first signal and the second signal are both at a different second signal level. Additionally, the method 800 comprises decoupling 808, by the at least one of the plurality of interpolation cells, the common node from at least one of the first potential and the second potential if the first signal and the second signal are at different signal levels. The method 800 further comprises switching 810, by the at least one of the plurality of interpolation cells and based on a state indicated by the respective selection signal, to coupling the common node to the second potential in response to a transition of either the leading one or the trailing one of the first signal and the second signal from the first signal level to the second signal level.

More details and aspects of the method are mentioned in connection with the proposed concept or one or more examples described above (e.g. FIGS. 1-7). The method may comprise one or more additional optional features corresponding to one or more aspects of the proposed concept or one or more examples described above.

The proposed architecture is however not limited to mobile devices. The proposed architecture may enable DTCs for a variety of applications, like polar modulation transmitters, LO generation for receivers, clocking for CPUs, I/Os etc. The very low dynamic errors may enable high performance systems like LTE transmitters. Other techniques have not demonstrated such low out-of-band noise like the proposed architecture. Also the high linearity of the proposed architecture may enable robust DTCs with limited to no calibration for LTE low-band or lower performance applications (e.g. clocking or PLL-feedback). Even in cases where some residual INL correction is needed, the improved INL may result in more robust systems and less frequent need for recalibration.

The examples as described herein may be summarized as follows:

Example 1 is an apparatus for interpolating between a first and a second signal, comprising: a plurality of interpolation cells coupled to a common node of the apparatus; and a control circuit configured to supply, based on a control word, respective selection signals to each of the plurality of interpolation cells, wherein at least one of the plurality of interpolation cells is configured to: couple the common node to a first potential if the first signal and the second signal are both at a first signal level, couple the common node to a second potential, which is different from the first potential, if the first signal and the second signal are both at a second signal level, which is different from the first level, and to decouple the common node from at least one of the first potential and the second potential if the first signal and the second signal are at different signal levels; and switch, based on a state indicated by the respective selection signal, to coupling the common node to the second potential in response to a transition of either the leading one or the trailing one of the first signal and the second signal from the first signal level to the second signal level.

In example 2, the at least one of the plurality of interpolation cells in the apparatus of example 1 is further configured to: switch to coupling the common node to the second potential in response to the transition of the trailing one of the first signal and the second signal from the first signal level to the second signal level, if the selection signal indicates a first state; or switch to coupling the common node to the second potential in response to the transition of the leading one of the first signal and the second signal from the first signal level to the second signal level, if the selection signal indicates a different second state.

In example 3, the at least one of the plurality of interpolation cells in the apparatus of example 1 or example 2 is further configured to: switch, based on the state indicated by the respective selection signal, to coupling the common node to the first potential in response to a subsequent transition of either the leading one or the trailing one of the first signal and the second signal from the second signal level to the first signal level.

In example 4, the at least one of the plurality of interpolation cells in the apparatus of example 3 is further configured to: switch to coupling the common node to the first potential in response to the transition of the trailing one of the first signal and the second signal from the second signal level to the first signal level, if the selection signal indicates a first state; or switch to coupling the common node to the first potential in response to the transition of the leading one of the first signal and the second signal from the second signal level to the first signal level, if the selection signal indicates a different second state.

In example 5, the at least one of the plurality of interpolation cells in the apparatus of any of the preceding examples comprises: a first pull-up/down path comprising a first plurality of transistors coupled between the first potential and the second potential, wherein the first pull-up/down path is configured to couple the common node to one of the first potential and the second potential if the selection signal indicates a first state; and a second pull-up/down path comprising a second plurality of transistors coupled between the first potential and the second potential, wherein the second pull-up/down path is configured to couple the common node to one of the first potential and the second potential if the selection signal indicates a different second state.

In example 6, the first pull-up/down path in the apparatus of example 5 comprises: a first transistor stack of a first conductivity type which is coupled between the first potential and a first node, wherein the first transistor stack is configured to receive the leading one of the first signal and the second signal, the trailing one of the first signal and the second signal, and the inverted selection signal at respective transistor control terminals of the first transistor stack; a second transistor stack of a different second conductivity type which is coupled between the second potential and the first node, wherein the second transistor stack is configured to receive the leading one of the first signal and the second signal, the trailing one of the first signal and the second signal, and the selection signal at respective transistor control terminals of the second transistor stack, wherein the first node is coupled to the common node.

In example 7, the second pull-up/down path in the apparatus of example 5 or example 6 comprises: a third transistor stack of the first conductivity type which is coupled between the first potential and a second node, wherein the third transistor stack is configured to receive a third signal, the leading one of the first signal and the second signal, and the selection signal at respective transistor control terminals of the third transistor stack; and a fourth transistor stack of the second conductivity type which is coupled between the second potential and the second node, wherein the fourth transistor stack is configured to receive a fourth signal, the leading one of the first signal and the second signal, and the inverted selection signal at respective transistor control terminals of the fourth transistor stack, wherein the second node is coupled to the common node.

In example 8, the apparatus of any of the preceding examples further comprises: a selection circuit configured to select the leading one of the first signal and the second signal, and to supply it to a first input node of the one of the plurality of interpolation cells that is dedicated to the leading one of the first signal and the second signal, wherein the selection circuit is further configured to select the trailing one of the first signal and the second signal, and to supply it to a second input node of the one of the plurality of interpolation cells that is dedicated to the trailing one of the first signal and the second signal.

In example 9, the selection circuit in the apparatus of example 8 comprises a plurality of multiplexers.

In example 10, the at least one of the plurality of interpolation cells in the apparatus of examples 1 to 4 comprises: first to third pull-up/down paths, each comprising a plurality of transistors coupled between the first potential and the second potential; and a cell control circuit configured to selectively control the first pull-up/down path to couple the common node to one of the first potential and the second potential if the selection signal indicates a first state, wherein the cell control circuit is further configured to selectively control one of the second and the third pull-up/down path to couple the common node to one of the first potential and the second potential if the selection signal indicates a different second state.

In example 11, the first pull-up/down path in the apparatus of example 10 comprises: a first transistor stack of a first conductivity type which is coupled to the first potential, wherein the first transistor stack is configured to receive the first signal and the second signal at respective transistor control terminals of the first transistor stack; a second transistor stack of a different second conductivity type which is coupled to the second potential, wherein the second transistor stack is configured to receive the first signal and the second signal at respective transistor control terminals of the second transistor stack.

In example 12, the second pull-up/down path in the apparatus of any of examples 10 or example 11 comprises: a third transistor stack of the first conductivity type which is coupled to the first potential, wherein the third transistor stack is configured to receive a third signal and the first signal at respective transistor control terminals of the third transistor stack; and a fourth transistor stack of the second conductivity type which is coupled to the second potential, wherein the fourth transistor stack is configured to receive a fourth signal and the first signal at respective transistor control terminals of the fourth transistor stack.

In example 13, the third pull-up/down path in the apparatus of any of examples 10 to 12 comprises: a fifth transistor stack of the first conductivity type which is coupled to the first potential, wherein the fifth transistor stack is configured to receive the third signal and the second signal at respective transistor control terminals of the fifth transistor stack; and an sixth transistor stack of the second conductivity type which is coupled to the second potential, wherein the sixth transistor stack is configured to receive the fourth signal and the second signal at respective transistor control terminals of the sixth transistor stack.

In example 14, in the apparatus of any of examples 10 to 13, the cell control circuit comprises a first pair of selection transistors configured to couple the common node to the second pull-up/down path if the selection signal indicates the second state and if the first signal leads the second signal, or the cell control circuit comprises a second pair of selection transistors configured to couple the common node to the third pull-up/down path if the selection signal indicates the second state and if the second signal leads the first signal.

In example 15, the at least one of the plurality of interpolation cells in the apparatus of example 5 further comprises: a first selection circuit configured to supply, based on a timing signal that indicates the temporal order of the first signal and the second signal, either the first signal or a third signal as a first selected signal to the first pull-up/down path; and a second selection circuit configured to supply, based on the timing signal, either the first signal or a fourth signal as a second selected signal to the first pull-up/down path.

In example 16, the first pull-up/down path in the apparatus of example 15 comprises: a first transistor stack of a first conductivity type which is coupled between the first potential and a first node, wherein the first transistor stack is configured to receive the second signal, the first selected signal and the inverted selection signal at respective transistor control terminals of the first transistor stack; and a second transistor stack of a different second conductivity type which is coupled between the second potential and the first node, wherein the second transistor stack is configured to receive the second signal, the second selected signal and the selection signal at respective transistor control terminals of the second transistor stack, wherein the first node is coupled to the common node.

In example 17, in the apparatus of example 15 or example 16, the first selection circuit is further configured to supply, based on the timing signal, either the second signal or the third signal as a third selected signal to the second pull-up/down path, and the second selection circuit is further configured to supply, based on the timing signal, either the second signal or the fourth signal as a fourth selected signal to the second pull-up/down path.

In example 18, the second pull-up/down path in the apparatus of example 17 comprises: a third transistor stack of the first conductivity type which is coupled between the first potential and a second node, wherein the third transistor stack is configured to receive the first signal, the third selected signal and the selection signal at respective transistor control terminals of the third transistor stack; and a fourth transistor stack of the second conductivity type which is coupled between the second potential and the second node, wherein the fourth transistor stack is configured to receive the first signal, the fourth selected signal and the inverted selection signal at respective transistor control terminals of the fourth transistor stack, wherein the second node is coupled to the common node.

In example 19, in the apparatus of any of examples 15 to 18, the first selection circuit comprises a first multiplexer configured to select, based on the timing signal, either the first signal or the third signal as the first selected signal, and wherein the second selection circuit comprises a second multiplexer configured to select, based on the timing signal, either the first signal or the fourth signal as the second selected signal.

In example 20, in the apparatus of example 19, the first multiplexer consists of a first and a second transistor of a second conductivity type that are coupled in parallel to an output node of the first multiplexer, wherein the first transistor is configured to receive the inverted timing signal at its control terminal and to receive the first signal at another terminal, and wherein the second transistor is configured to receive the timing signal at its control terminal and to receive the third signal at another terminal.

In example 21, in the apparatus of example 19 or example 20, the second multiplexer consists of a third and a fourth transistor of a first conductivity type that are coupled in parallel to an output node of the second multiplexer, wherein the third transistor is configured to receive the timing signal at its control terminal and to receive the first signal at another terminal, and wherein the fourth transistor is configured to receive the inverted timing signal at its control terminal and to receive the fourth signal at another terminal.

In example 22, in the apparatus of any of examples 7, 12, 13 or 15 to 21, the third signal is a constant third potential, and wherein the fourth signal is a constant fourth potential.

In example 23, in the apparatus of any of examples 7, 12, 13 or 15 to 21, the first signal and the second signal are oscillation signals, and the third signal and the fourth signal are an oscillation signal that leads the leading one of the first signal and the second signal by a fraction of the oscillation period of the first signal.

In example 24, the apparatus of any of the preceding examples further comprises a frequency divider circuit configured to generate the first signal and the second signal based on an oscillation signal.

In example 25, the frequency divider circuit in the apparatus of example 24 comprises a multi-modulus divider.

Example 26 is a digital-to-time converter comprising an apparatus for interpolating between a first signal and a second signal according to any of examples 1 to 25.

Example 27 is a transmitter comprising a digital-to-time converter according example 26.

Example 28 is a receiver comprising a digital-to-time converter according to example 26.

Example 29 is a mobile device comprising a transmitter according to example 27, or a receiver according to example 28.

In example 30, the mobile device of example 29 further comprises at least one antenna element coupled to the transmitter, or to the receiver.

Example 31 is a means for interpolating between a first and a second signal, comprising: a plurality of cellular means coupled to a common node; and a means for supplying, based on a control word, respective selection signals to each of the plurality of cellular means, wherein at least one of the plurality of cellular means is configured to: couple the common node to a first potential if the first signal and the second signal are both at a first signal level, couple the common node to a second potential, which is different from the first potential, if the first signal and the second signal are both at a second signal level, which is different from the first signal level, and decouple the common node from at least one of the first potential and the second potential if the first signal and the second signal are at different signal levels; and switch, based on a state indicated by the respective selection signal, to coupling the common node to the second potential in response to a transition of either the leading one or the trailing one of the first signal and the second signal from the first signal level to the second signal level.

In example 32, the least one of the plurality of cellular means in the means of example 31 is further configured to: switch, based on the state indicated by the respective selection signal, to coupling the common node to the first potential in response to a transition of either the leading one or the trailing one of the first signal and the second signal from the second signal level to the first signal level.

Example 33 is a method for interpolating between a first and a second signal using a plurality of interpolation cells coupled to a common node, comprising: supplying, based on a control word, respective selection signals to each of the plurality of interpolation cells; coupling, by at least one of the plurality of interpolation cells, the common node to a first potential if the first signal and the second signal are both at a first signal level; coupling, by the at least one of the plurality of interpolation cells, the common node to a second potential, which is different from the first potential, if the first signal and the second signal are both at a second signal level, which is different from the first signal level; decoupling, by the at least one of the plurality of interpolation cells, the common node from at least one of the first potential and the second potential if the first signal and the second signal are at different signal levels; and switching, by the at least one of the plurality of interpolation cells and based on a state indicated by the respective selection signal, to coupling the common node to the second potential in response to a transition of either the leading one or the trailing one of the first signal and the second signal from the first signal level to the second signal level.

In example 34, switching to coupling the common node to the second potential in the method of example 33 comprises: switching to coupling the common node to the second potential in response to the transition of the trailing one of the first signal and the second signal from the first signal level to the second signal level, if the selection signal indicates a first state; or switching to coupling the common node to the second potential in response to the transition of the leading one of the first signal and the second signal from the first signal level to the second signal level, if the selection signal indicates a different second state.

In example 35, the method of example 33 or example 34 further comprises: switching, based on the state indicated by the respective selection signal, to coupling the common node to the first potential in response to a subsequent transition of either the leading one or the trailing one of the first signal and the second signal from the second signal level to the first signal level.

In example 36, switching to coupling the common node to the first potential in the method of example 35 comprises: switching to coupling the common node to the first potential in response to the transition of the trailing one of the first signal and the second signal from the second signal level to the first signal level, if the selection signal indicates a first state; or switching to coupling the common node to the first potential in response to the transition of the leading one of the first signal and the second signal from the second signal level to the first signal level, if the selection signal indicates a different second state.

In example 37, the method of any of examples 33 to 36 further comprises: selecting the leading one of the first signal and the second signal; supplying the leading one of the first signal and the second signal to a first input node of the one of the plurality of interpolation cells that is dedicated to the leading one of the first signal and the second signal; selecting the trailing one of the first signal and the second signal; and supplying the trailing one of the first signal and the second signal to a second input node of the one of the plurality of interpolation cells that is dedicated to the trailing one of the first signal and the second signal.

Example 38 is a computer readable storage medium having stored thereon a program having a program code for performing the method of any of examples 33 to 37, when the program is executed on a computer or processor.

Example 39 is a computer program having a program code configured to perform the method of any of examples 33 to 37, when the computer program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for interpolating between a first and a second signal, comprising:
    a plurality of interpolation cells coupled to a common node of the apparatus; and
    a control circuit configured to supply, based on a control word, respective selection signals to each of the plurality of interpolation cells,
    wherein at least one of the plurality of interpolation cells is configured to:
    couple the common node to a first potential if the first signal and the second signal are both at a first signal level, couple the common node to a second potential, which is different from the first potential, if the first signal and the second signal are both at a second signal level, which is different from the first level, and to decouple the common node from at least one of the first potential and the second potential if the first signal and the second signal are at different signal levels; and
    switch, based on a state indicated by the respective selection signal, to coupling the common node to the second potential in response to a transition of either the leading one or the trailing one of the first signal and the second signal from the first signal level to the second signal level.

2. The apparatus of claim 1, wherein the at least one of the plurality of interpolation cells is further configured to:
    switch to coupling the common node to the second potential in response to the transition of the trailing one of the first signal and the second signal from the first signal level to the second signal level, if the selection signal indicates a first state; or
    switch to coupling the common node to the second potential in response to the transition of the leading one of the first signal and the second signal from the first signal level to the second signal level, if the selection signal indicates a different second state.

3. The apparatus of claim 1, wherein the at least one of the plurality of interpolation cells is further configured to:
    switch, based on the state indicated by the respective selection signal, to coupling the common node to the first potential in response to a subsequent transition of either the leading one or the trailing one of the first signal and the second signal from the second signal level to the first signal level.

4. The apparatus of claim 3, wherein the at least one of the plurality of interpolation cells is further configured to:
    switch to coupling the common node to the first potential in response to the transition of the trailing one of the first signal and the second signal from the second signal level to the first signal level, if the selection signal indicates a first state; or
    switch to coupling the common node to the first potential in response to the transition of the leading one of the first signal and the second signal from the second signal level to the first signal level, if the selection signal indicates a different second state.

5. The apparatus of claim 1, wherein the at least one of the plurality of interpolation cells comprises:
    a first pull-up/down path comprising a first plurality of transistors coupled between the first potential and the second potential, wherein the first pull-up/down path is configured to couple the common node to one of the first potential and the second potential if the selection signal indicates a first state; and
    a second pull-up/down path comprising a second plurality of transistors coupled between the first potential and the second potential, wherein the second pull-up/down path is configured to couple the common node to one of the first potential and the second potential if the selection signal indicates a different second state.

6. The apparatus of claim 5, wherein the first pull-up/down path comprises:
   a first transistor stack of a first conductivity type which is coupled between the first potential and a first node, wherein the first transistor stack is configured to receive the leading one of the first signal and the second signal, the trailing one of the first signal and the second signal, and the inverted selection signal at respective transistor control terminals of the first transistor stack;
   a second transistor stack of a different second conductivity type which is coupled between the second potential and the first node, wherein the second transistor stack is configured to receive the leading one of the first signal and the second signal, the trailing one of the first signal and the second signal, and the selection signal at respective transistor control terminals of the second transistor stack,
   wherein the first node is coupled to the common node.

7. The apparatus of claim 5, wherein the second pull-up/down path comprises:
   a third transistor stack of the first conductivity type which is coupled between the first potential and a second node, wherein the third transistor stack is configured to receive a third signal, the leading one of the first signal and the second signal, and the selection signal at respective transistor control terminals of the third transistor stack; and
   a fourth transistor stack of the second conductivity type which is coupled between the second potential and the second node, wherein the fourth transistor stack is configured to receive a fourth signal, the leading one of the first signal and the second signal, and the inverted selection signal at respective transistor control terminals of the fourth transistor stack,
   wherein the second node is coupled to the common node.

8. The apparatus of claim 7, wherein the third signal is a constant third potential, and wherein the fourth signal is a constant fourth potential.

9. The apparatus of claim 7, wherein the first signal and the second signal are oscillation signals, and wherein the third signal and the fourth signal are an oscillation signal that leads the leading one of the first signal and the second signal by a fraction of the oscillation period of the first signal.

10. The apparatus of claim 5, wherein the at least one of the plurality of interpolation cells further comprises:
    a first selection circuit configured to supply, based on a timing signal that indicates the temporal order of the first signal and the second signal, either the first signal or a third signal as a first selected signal to the first pull-up/down path; and
    a second selection circuit configured to supply, based on the timing signal, either the first signal or a fourth signal as a second selected signal to the first pull-up/down path.

11. The apparatus of claim 10, wherein the first pull-up/down path comprises:
    a first transistor stack of a first conductivity type which is coupled between the first potential and a first node, wherein the first transistor stack is configured to receive the second signal, the first selected signal and the inverted selection signal at respective transistor control terminals of the first transistor stack; and
    a second transistor stack of a different second conductivity type which is coupled between the second potential and the first node, wherein the second transistor stack is configured to receive the second signal, the second selected signal and the selection signal at respective transistor control terminals of the second transistor stack,
    wherein the first node is coupled to the common node.

12. The apparatus of claim 10, wherein the first selection circuit is further configured to supply, based on the timing signal, either the second signal or the third signal as a third selected signal to the second pull-up/down path, and wherein the second selection circuit is further configured to supply, based on the timing signal, either the second signal or the fourth signal as a fourth selected signal to the second pull-up/down path.

13. The apparatus of claim 12, wherein the second pull-up/down path comprises:
    a third transistor stack of the first conductivity type which is coupled between the first potential and a second node, wherein the third transistor stack is configured to receive the first signal, the third selected signal and the selection signal at respective transistor control terminals of the third transistor stack; and
    a fourth transistor stack of the second conductivity type which is coupled between the second potential and the second node, wherein the fourth transistor stack is configured to receive the first signal, the fourth selected signal and the inverted selection signal at respective transistor control terminals of the fourth transistor stack,
    wherein the second node is coupled to the common node.

14. The apparatus of claim 10, wherein the first selection circuit comprises a first multiplexer configured to select, based on the timing signal, either the first signal or the third signal as the first selected signal, and wherein the second selection circuit comprises a second multiplexer configured to select, based on the timing signal, either the first signal or the fourth signal as the second selected signal.

15. The apparatus of claim 14, wherein the first multiplexer consists of a first and a second transistor of a second conductivity type that are coupled in parallel to an output node of the first multiplexer, wherein the first transistor is configured to receive the inverted timing signal at its control terminal and to receive the first signal at another terminal, and wherein the second transistor is configured to receive the timing signal at its control terminal and to receive the third signal at another terminal.

16. The apparatus of claim 14, wherein the second multiplexer consists of a third and a fourth transistor of a first conductivity type that are coupled in parallel to an output node of the second multiplexer, wherein the third transistor is configured to receive the timing signal at its control terminal and to receive the first signal at another terminal, and wherein the fourth transistor is configured to receive the inverted timing signal at its control terminal and to receive the fourth signal at another terminal.

17. The apparatus of claim 1, further comprising:
    a selection circuit configured to select the leading one of the first signal and the second signal, and to supply it to a first input node of the one of the plurality of interpolation cells that is dedicated to the leading one of the first signal and the second signal,
    wherein the selection circuit is further configured to select the trailing one of the first signal and the second signal, and to supply it to a second input node of the one of the plurality of interpolation cells that is dedicated to the trailing one of the first signal and the second signal.

18. The apparatus of claim 17, wherein the selection circuit comprises a plurality of multiplexers.

19. The apparatus of claim 1, further comprising a frequency divider circuit configured to generate the first signal and the second signal based on an oscillation signal.

20. A digital-to-time converter comprising an apparatus for interpolating between a first signal and a second signal according to claim 1.

21. A method for interpolating between a first and a second signal using a plurality of interpolation cells coupled to a common node, comprising:
- supplying, based on a control word, respective selection signals to each of the plurality of interpolation cells;
- coupling, by at least one of the plurality of interpolation cells, the common node to a first potential if the first signal and the second signal are both at a first signal level;
- coupling, by the at least one of the plurality of interpolation cells, the common node to a second potential, which is different from the first potential, if the first signal and the second signal are both at a second signal level, which is different from the first signal level;
- decoupling, by the at least one of the plurality of interpolation cells, the common node from at least one of the first potential and the second potential if the first signal and the second signal are at different signal levels; and
- switching, by the at least one of the plurality of interpolation cells and based on a state indicated by the respective selection signal, to coupling the common node to the second potential in response to a transition of either the leading one or the trailing one of the first signal and the second signal from the first signal level to the second signal level.

22. The method of claim 21, switching to coupling the common node to the second potential comprises:
- switching to coupling the common node to the second potential in response to the transition of the trailing one of the first signal and the second signal from the first signal level to the second signal level, if the selection signal indicates a first state; or
- switching to coupling the common node to the second potential in response to the transition of the leading one of the first signal and the second signal from the first signal level to the second signal level, if the selection signal indicates a different second state.

23. The method of claim 21, wherein the method further comprises:
- switching, based on the state indicated by the respective selection signal, to coupling the common node to the first potential in response to a subsequent transition of either the leading one or the trailing one of the first signal and the second signal from the second signal level to the first signal level.

24. The method of claim 23, wherein switching to coupling the common node to the first potential comprises:
- switching to coupling the common node to the first potential in response to the transition of the trailing one of the first signal and the second signal from the second signal level to the first signal level, if the selection signal indicates a first state; or
- switching to coupling the common node to the first potential in response to the transition of the leading one of the first signal and the second signal from the second signal level to the first signal level, if the selection signal indicates a different second state.

25. The method of claim 21, further comprising:
- selecting the leading one of the first signal and the second signal;
- supplying the leading one of the first signal and the second signal to a first input node of the one of the plurality of interpolation cells that is dedicated to the leading one of the first signal and the second signal;
- selecting the trailing one of the first signal and the second signal; and
- supplying the trailing one of the first signal and the second signal to a second input node of the one of the plurality of interpolation cells that is dedicated to the trailing one of the first signal and the second signal.

* * * * *